(12) United States Patent
Trindade et al.

(10) Patent No.: US 12,531,537 B2
(45) Date of Patent: Jan. 20, 2026

(54) SUSPENDED COMPONENTS AND FUNCTIONAL FRAMES

(71) Applicant: X-Celeprint Limited, Dublin (IE)

(72) Inventors: António José Marques Trindade, Cork (IE); Ronald S. Cok, Rochester, NY (US); Raja Fazan Gul, Cork (IE)

(73) Assignee: X-Celeprint Limited, Dublin (IE)

( * ) Notice: Subject to any disclaimer, the term of this patent is extended or adjusted under 35 U.S.C. 154(b) by 951 days.

(21) Appl. No.: 17/721,766

(22) Filed: Apr. 15, 2022

(65) Prior Publication Data

US 2023/0336150 A1 Oct. 19, 2023

(51) Int. Cl.
| | |
|---|---|
| H03H 9/17 | (2006.01) |
| B41F 16/00 | (2006.01) |
| H03H 3/02 | (2006.01) |
| H03H 9/02 | (2006.01) |
| H03H 9/05 | (2006.01) |
| H03H 9/10 | (2006.01) |

(52) U.S. Cl.
CPC .......... *H03H 9/0595* (2013.01); *B41F 16/00* (2013.01); *H03H 3/02* (2013.01); *H03H 9/02031* (2013.01); *H03H 9/105* (2013.01); *H03H 9/176* (2013.01)

(58) Field of Classification Search
CPC ............................ H03H 9/0595; H03H 9/105
See application file for complete search history.

(56) References Cited

U.S. PATENT DOCUMENTS

| | | | |
|---|---|---|---|
| 5,394,969 | A | 3/1995 | Harbaugh |
| 6,078,229 | A | 6/2000 | Funada et al. |
| 6,131,718 | A | 10/2000 | Witschorik |
| 6,566,981 | B2 | 5/2003 | Urabe et al. |
| 6,627,966 | B2 | 9/2003 | Jeong et al. |
| 6,911,708 | B2 | 6/2005 | Park |
| 7,463,117 | B2 | 12/2008 | Ohara et al. |
| 7,622,367 | B1 | 11/2009 | Nuzzo et al. |
| 7,943,491 | B2 | 5/2011 | Nuzzo et al. |
| 7,982,364 | B2 | 7/2011 | Takayama et al. |
| 7,984,648 | B2 | 7/2011 | Horning et al. |
| 7,990,233 | B2 | 8/2011 | Suzuki |
| 8,391,688 | B2 | 3/2013 | Zhang et al. |

(Continued)

FOREIGN PATENT DOCUMENTS

WO WO-2011/129855 A2 10/2011

OTHER PUBLICATIONS

Cok, R.S. et al., Inorganic light-emitting diode displays using micro-transfer printing, J. Soc. Inf. Disp., 25(10):589-609 (2017).

*Primary Examiner* — Bryan P Gordon

(74) *Attorney, Agent, or Firm* — Choate, Hall & Stewart LLP; Michael D. Schmitt

(57) ABSTRACT

According to embodiments of the present disclosure, a micro-system comprises a frame, a component attached to and supported by the frame, and an electrically functional micro-device disposed on or in the frame and electrically connected to the component. The component can be exclusively supported by the frame. The frame can comprise the micro-device and can comprise the same materials and layer structure as the component. The component, frame, and micro-device can comprise a piezoelectric material. The component can be an acoustic resonator and the micro-device can be a capacitor.

20 Claims, 20 Drawing Sheets

(56) References Cited

U.S. PATENT DOCUMENTS

| | | |
|---|---|---|
| 8,506,867 B2 | 8/2013 | Menard |
| 8,618,721 B2 | 12/2013 | Ichikawa et al. |
| 8,722,458 B2 | 5/2014 | Rogers et al. |
| 8,791,822 B2 | 7/2014 | Delia et al. |
| 8,827,550 B2 | 9/2014 | Abdelmoneum et al. |
| 8,889,485 B2 | 11/2014 | Bower |
| 9,997,102 B2 | 6/2018 | Rotzoll et al. |
| 10,103,069 B2 | 10/2018 | Bower et al. |
| 10,150,325 B2 | 12/2018 | Cok et al. |
| 10,150,326 B2 | 12/2018 | Cok et al. |
| 10,153,256 B2 | 12/2018 | Cok et al. |
| 10,198,890 B2 | 2/2019 | Rotzoll et al. |
| 10,200,013 B2 | 2/2019 | Bower et al. |
| 10,224,460 B2 | 3/2019 | Bower et al. |
| 10,361,677 B2 | 7/2019 | Bower et al. |
| 10,468,363 B2 | 11/2019 | Prevatte et al. |
| 10,804,880 B2 | 10/2020 | Cok |
| 11,274,035 B2 | 3/2022 | Gul et al. |
| 2005/0150740 A1 | 7/2005 | Finkenzeller et al. |
| 2010/0189444 A1 | 7/2010 | Vernooy et al. |
| 2014/0210314 A1* | 7/2014 | Bhattacharjee .......... H03H 9/17 310/357 |
| 2015/0145376 A1* | 5/2015 | Sun ...................... H10N 30/304 29/25.35 |
| 2015/0372053 A1 | 12/2015 | Bower et al. |
| 2016/0093600 A1 | 3/2016 | Bower et al. |
| 2017/0155038 A1* | 6/2017 | Caraveo ............. H10N 30/2042 |
| 2017/0229630 A1* | 8/2017 | Zhan ....................... H02N 3/00 |
| 2017/0244386 A1 | 8/2017 | Bower et al. |
| 2020/0176671 A1* | 6/2020 | Cok ................... H01L 23/28 |
| 2021/0002128 A1 | 1/2021 | Cok et al. |
| 2021/0135648 A1 | 5/2021 | Trindade et al. |
| 2021/0135649 A1 | 5/2021 | Trindade et al. |
| 2021/0339552 A1 | 11/2021 | Cok et al. |
| 2022/0112078 A1 | 4/2022 | Rubino |

\* cited by examiner

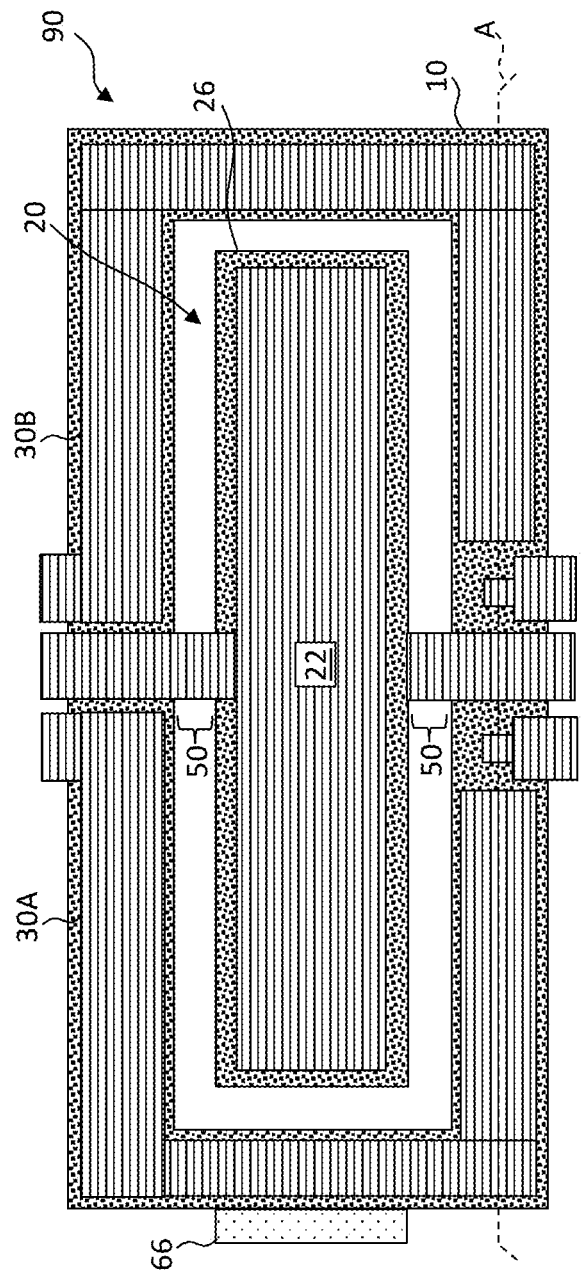
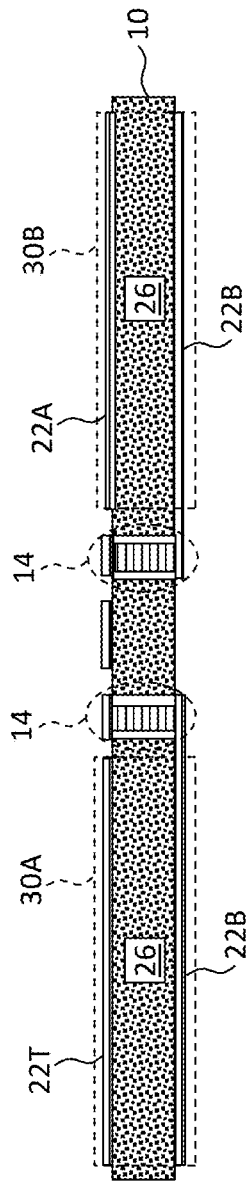
FIG. 7A
FIG. 7B

SUSPENDED COMPONENTS AND FUNCTIONAL FRAMES

TECHNICAL FIELD

The present disclosure relates generally to printed or printable electronic structures and methods including micro-assembled devices and components.

BACKGROUND

Micro-electro-mechanical systems (MEMS) are used for many applications, including processing and controlling electronic and optical signals. Such systems incorporate small mechanical structures made using photolithographic methods and materials and can be integrated into electronic, optical, or electro-optic systems. For example, accelerometers, interferometric modulators, scanners, gyroscopes, piezoelectric energy harvesting, and pressure sensors can be constructed using such techniques. Resonant MEMS devices with electrodes can be used to process signals and produce energy from mechanical oscillation, for example as in acoustic wave filters. Typical designs can have solidly mounted beams or beams that are anchored on one or both ends or sides, for example as discussed in U.S. Pat. Nos. 7,984,648, 8,827,550, 7,990,233, U.S. Patent Application Publication No. 2010/0189444, and PCT Publication No. WO 2011/129855.

Substrates with electronically active components, including MEMs devices, distributed over the extent of the substrate can be used in a variety of electronic systems. Many systems require different kinds of materials for electronically active components providing different functions, for example light-emitting diodes made in a crystalline compound semiconductor, logic circuits made in crystalline silicon, and MEMs devices made in a piezoelectric material. The electronically active components are typically assembled on the substrate, for example using individually packaged surface-mount integrated-circuit devices and pick-and-place tools or using die bonding. However, these methods can be limited to large component sizes, have poor alignment accuracy, are limited in the number of component types available for assembly in a single system, and have poor source material utilization.

Other methods for transferring active components from one substrate to another are described in U.S. Pat. No. 7,943,491. In an example of these approaches, small integrated circuits are formed on a native semiconductor source wafer. The small unpackaged integrated circuits, or chiplets, are released from the native source wafer by etching a layer formed beneath the circuits. A viscoelastic stamp is pressed against the native source wafer and the process side of the chiplets is adhered to individual stamp posts. The chiplets on the stamp are then pressed against a destination substrate or backplane with the stamp and adhered to the destination substrate. In another example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate or backplane.

In general, smaller and more densely integrated components provide smaller, more portable systems with lower costs and lighter weight. There remains an on-going need for such systems and structures that are readily constructed with improved performance and that are or can be integrated or micro-assembled into electronic and micro-electro-mechanical systems.

SUMMARY

The present disclosure provides, inter alia, structures, materials, and methods for integrating micro-system structures and enabling their release from a source wafer (source substrate) and transfer printing (e.g., micro-transfer printing) the micro-system structures from the source wafer to a target substrate.

According to embodiments of the present disclosure, a micro-system comprises a frame and a component separated from the frame by a gap except where the component is connected to the frame, for example laterally attached to the frame (e.g., by a cantilever support). In some embodiments, one or more cantilever supports extend from the component across the gap to the frame. The component can be exclusively supported by the frame. The frame and component can either or both be substantially rectangular. An electrically functional micro-device (a micro-device) can be disposed on or in or comprise the frame and can be electrically connected to the component. The gap separating the frame from the component can have a substantially common width except where the cantilever supports are connected to the frame. The component can comprise a piezoelectric material and electrodes, and the electrodes can extend over the cantilever supports to the frame or micro-device, or both.

In some embodiments, the micro-device is native to and formed on or in the frame. In some embodiments, the micro-device is non-native to and disposed on the frame. The non-native electrically functional micro-device can be a micro-transferred micro-device printed onto the frame. In some embodiments, the frame or micro-system (or both) can comprise or be physically connected to at least a portion of frame tether or device tether, respectively (e.g., a broken (e.g., fractured) or separated frame tether or device tether, respectively). In some embodiments, the micro-device is or comprises one or more capacitors. The one or more capacitors can comprise no less than 20%, 30%, 40%, 50%, 60%, 70%, or 80% of the frame.

The frame can comprise one or more of the materials comprising the component. In some embodiments, each of two or more of the frame, the micro-device, and the component comprise a same material or comprises two or more same layers disposed in a common order, or both.

The component can comprise or be a piezoelectric or silicon component. The component can be an acoustic resonator. The component can comprise potassium sodium niobate (KNN, e.g., KNaNbO3). The micro-device can comprise a piezoelectric material disposed between two electrodes, e.g., forming a capacitor, and can comprise the same materials, layers, and structure as the component. In some embodiments, the micro-device is operable to control or is responsive to the component or is a portion of an electrical circuit that includes both the micro-device and the component, or both. The micro-device can be a circuit, circuit component, or an integrated circuit.

A cantilever support can physically attach the component to the frame.

An electrode can be disposed on the component that can extend over or on the cantilever support onto the frame. The electrode can be electrically connected to the micro-device, to the component, or both.

Some embodiments of the present disclosure can comprise a cap disposed over the frame and component and adhered to the frame. The cap can be disposed by micro-transfer printing and can comprise a cap tether. The cap can be disposed on the frame by micro-transfer printing and can comprise at least a portion of a cap tether (e.g., a broken (e.g., fractured) or separated cap tether).

Some embodiments of the present disclosure can comprise a target substrate and one or more micro-system(s) disposed on the target substrate. The target substrate can comprise a cavity and the component can be disposed on and suspended over the cavity in the target substrate. A cap can be disposed over the micro-device, frame, and component and adhered to the target substrate. The cap can be disposed by micro-transfer printing and can comprise a cap tether.

According to embodiments of the present disclosure, a micro-system wafer can comprise a source wafer comprising a sacrificial layer and the sacrificial layer can comprise a sacrificial portion adjacent to an anchor. A micro-system can be disposed entirely and directly over the sacrificial portion in a direction orthogonal to a surface of the sacrificial portion on or over which the micro-device is disposed. The sacrificial portion can be a space between the source wafer and the micro-system, and the micro-system can be attached to the anchor with a tether and suspended over the space.

According to embodiments of the present disclosure, a micro-system wafer can comprise a source wafer comprising an anchor and a micro-system suspended over a space between the micro-system and the source wafer by a tether attaching the frame to the anchor.

According to embodiments of the present disclosure, a method of making a micro-device structure comprises providing a micro-system source wafer comprising a sacrificial layer comprising sacrificial portions separated by anchor portions, forming a micro-system comprising a frame, micro-device, and a component separated from the frame by a gap except where the component is connected to the frame with cantilever supports extending from the component across the gap to the frame, the micro-system disposed entirely directly over each sacrificial portion, optionally disposing a cap over the micro-system on the frame and adhering the cap to the frame, releasing the micro-systems by etching the sacrificial portions, micro-transfer printing the micro-systems from the source wafer to a target substrate, and optionally disposing a cap over the micro-system and adhering the cap to the target substrate.

According to embodiments of the present disclosure, a micro-system comprises a frame, a micro-device disposed on, in, or comprising at least a portion of the frame, and a component separated from the frame by a gap and connected to the frame only with cantilever supports extending from the component across the gap to the frame.

According to embodiments of the present disclosure, a micro-structure comprises a target substrate comprising a cavity and a micro-system disposed on or over the target substrate such that the component is disposed or suspended over the cavity, for example directly over the cavity in a direction orthogonal to a surface of the target substrate on or over which the micro-system is disposed.

According to some embodiments, the transfer device is a stamp comprising a stamp post, one of the picked-up micro-devices is disposed on the stamp after being picked up, and the stamp post has an external dimension substantially the same as a corresponding external dimension of at least one of the micro-devices.

In some embodiments, a micro-system comprises a frame, micro-device, and a component suspended from the frame. The micro-device, frame, or component can have at least one of an exterior length and a width less than or equal to 1 mm (e.g., less than or equal to 500 µm, less than or equal to 200 µm, less than or equal to 100 µm, less than or equal to 50 µm, less than or equal to 20 µm, less than or equal to 10 µm, or less than or equal to 5 µm). The micro-device, frame, or component can have a thickness of no greater than 100 µm (e.g., no greater than 50 µm, no greater than 20 µm, no greater than 10 µm, no greater than 5 µm, or no greater than 2 µm). The micro-device, frame, or component can comprise a material that is a semiconductor, a piezoelectric material, a conductive material such as metal, and a dielectric material. The micro-device, frame, or component can comprise any one or combination of SiO2, SiNx, KNN (potassium sodium niobate), AlN (aluminum nitride), PZT (lead zirconate titanate), aluminum, silver, copper, and gold. The component can be an electronic component, an opto-electronic component, a piezo-electric component, a resonator component, an acoustic filter component, or a micro-electro-mechanical structure component and can comprise an active or passive electrical circuit. The component can be responsive to at least one of electrical energy, optical energy, electromagnetic energy, and mechanical energy.

The micro-system can be adhered or attached to a target substrate only by a micro-system bottom side. The micro-system can comprise electrically conductive connection posts. In some embodiments, a micro-system comprises two, three, or at least four connection posts The frame can be adhered to the target substrate around a cavity in the target substrate. The component can be suspended over the target substrate or over the cavity in the target substrate. In some embodiments, the target substrate is a semiconductor substrate (e.g., a silicon or compound semiconductor substrate) comprising one or more electronic substrate circuits, the target substrate is a glass substrate, or the target substrate is a polymer substrate. The electronic substrate circuit(s) can be electrically connected to the micro-system.

In some embodiments, the micro-system has a top side and a bottom side opposite the top side and the micro-system comprises a component top electrode disposed on the top side of the component that can extend over at least a portion of the frame, for example a top side of the frame. In some embodiments, the micro-system structure comprises a component bottom electrode disposed at least partially on the bottom side of the component. The bottom electrode can pass through a via and extend over at least a portion of the frame, for example a top side of the frame.

In some embodiments, the frame comprises a dielectric layer and one or more connection posts that extend from the dielectric layer. The connection posts can each be electrically connected to an electrode (e.g., a connection post can be electrically connected to a top electrode and a connection post can be electrically connected to a bottom electrode). The connection posts can each have a distal end and a proximal end, the distal end having an area smaller than an area of the proximal end, wherein the distal end forms a sharp point. The connection posts can comprise planar edges or a pyramidal structure.

In some embodiments, a micro-system source wafer comprises a sacrificial layer comprising sacrificial portions and each sacrificial portion is adjacent to one or more anchors. A micro-system can be disposed entirely, completely, or exclusively over each of the sacrificial portions in a direction orthogonal to a surface of the micro-system source wafer on which the micro-system is disposed. In some embodiments, the micro-devices can comprise portions that extend over or form part of a frame tether or anchor, for example encapsulation layers or dielectric substrate layers. In some embodiments, the micro-system source wafer comprises trenches, pits, indentations, or holes in which connection posts are disposed or formed.

In some embodiments, a printed micro-system structure comprises a target substrate having a target substrate surface, substrate electrodes (e.g., substrate contact pads) disposed on the target substrate surface, and a micro-system disposed on the target substrate surface. The micro-system can comprise electrodes that are electrically connected to the substrate electrodes or contact pads. In some embodiments, the micro-system comprises connection posts that are in electrical contact with (e.g., embedded in or piercing) the substrate electrodes or contact pads. According to some embodiments, the substrate electrodes are substantially planar.

According to some embodiments of the present disclosure, solder is disposed on the substrate electrodes and the solder coats at least a portion of the connection posts. According to some embodiments, a non-directional deposition of metal coats both the connection posts and the substrate electrodes, for example by chemical vapor, electroless plating, or electroplating. According to some embodiments, the connection posts are wave soldered. Heating and then cooling the solder can physically connect each of the connection posts to one of the substrate electrodes.

In some embodiments, a printed micro-system structure comprises a patterned layer of adhesive adhering any one or more of the connection posts, the frame, or the micro-system to the target substrate surface. The patterned layer of adhesive can contact only a portion of a bottom surface of the micro-system to the target substrate surface (e.g., the frame). The adhesive can be a cured adhesive, an uncured adhesive, a partially cured adhesive, or a soft-cured adhesive. The adhesive can be a curable adhesive that is only partially cured. The adhesive can comprise an organic material, a polymer, a resin, or an epoxy. The adhesive can be a photoresist. The photoresist can be a positive photoresist or a negative photoresist. According to some embodiments of the present disclosure, the adhesive holds the component in compression against the target substrate.

According to some embodiments of the present disclosure, each of the micro-systems picked up by a micro-transfer printing stamp comprises a broken (e.g., fractured) or separated frame tether, for example as a consequence of micro-transfer printing the micro-system from a micro-system source wafer to the target substrate.

According to embodiments of the present disclosure, micro-systems comprising components suspended from a frame by cantilever supports and a micro-device disposed on or in or comprising the frame can be smaller, use less power, and enable more highly integrated electronic systems incorporating the micro-systems. In some embodiments, some such micro-systems are integrated with target substrates comprising different materials from the micro-system or component. Target substrates can comprise a cavity over which the component is suspended.

Embodiments of the present disclosure can provide smaller and more densely integrated components for smaller, more portable systems with reduced volume, lower costs, and lighter weight. There remains an on-going need for such systems and structures that are readily constructed with improved performance or integration and that are or can be micro-assembled into electronic and micro-electromechanical systems.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIG. 7A is a plan view of a micro-system comprising a frame, a component, and two electrically functional micro-devices that are each more than 20% of the frame according to illustrative embodiments of the present disclosure;

FIG. 7B is a cross section taken along cross section line A of FIG. 7A according to illustrative embodiments of the present disclosure;

Figure 1:
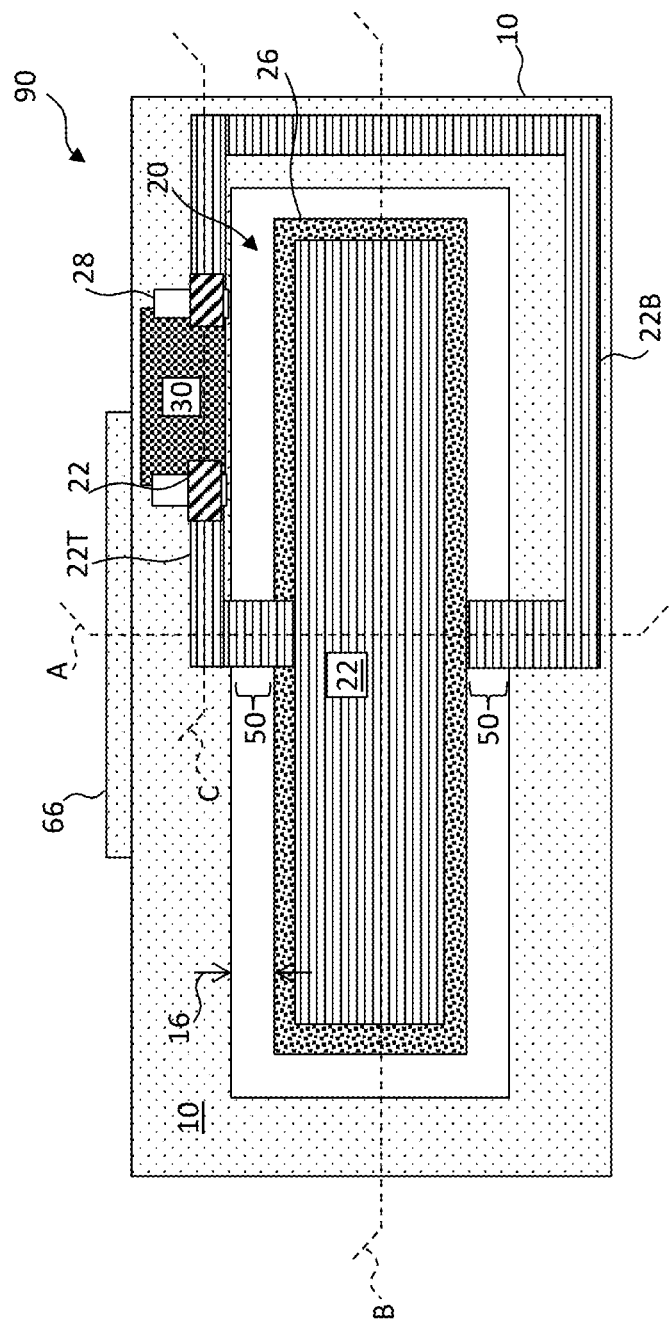
FIG. 1 is a plan view of a micro-system comprising a component attached to and supported by a frame and an electrically functional micro-device disposed on or in or comprising the frame and electrically connected to the component with electrodes disposed on the frame according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale. The vertical scale of the Figures can be exaggerated to clarify the illustrated structures.

DETAILED DESCRIPTION OF CERTAIN EMBODIMENTS

Electronic circuit performance and density are important attributes of electronic systems. Embodiments of the present disclosure provide a micro-system, comprising a component attached to a frame with a micro-device, that can be or is micro-transfer printed, for example from a micro-system source wafer to a target substrate. The component can be suspended from the frame with one or more cantilever supports and is otherwise free to move, for example as a micro-electro-mechanical micro-device such as an acoustic resonator or filter. The micro-device and the component can be parts of a common circuit. The micro-system can be very small and thin, enabling systems of reduced size and efficient performance.

According to embodiments of the present disclosure and as illustrated in FIG. 1, a micro-system 90 can comprise a frame 10, a component 20 attached to and supported by frame 10, for example by cantilever support(s) 50, and an electrically functional micro-device 30 (also referred to as micro-device 30) disposed on or in frame 10 and directly or indirectly electrically connected to component 20 in a common electrical circuit, for example with one or more electrodes 22. (In FIG. 1, component 20 is attached by two cantilever supports 50 and electrically connected by two electrodes 22 but other numbers of cantilever supports 50 and electrodes 22 can be used.) Component 20 can be physically connected to and exclusively supported by frame 10, for example by one or more cantilever supports 50, and can be a piezoelectric or silicon component 20. Component 20 can be or comprise a micro-electro-mechanical (MEM) structure. Component 20 can be or comprise an acoustic resonator and can comprise a piezoelectric material such as potassium sodium niobate (KNN or $KNaNbO_3$). Similarly, micro-device 30 can be a piezoelectric or silicon device.

Component 20 can have, comprise, or be in contact with electrodes 22, for example a top electrode 22T disposed on a top side of component 20 and a bottom electrode 22B disposed on a bottom side of component 20. Component 20 can comprise or be in contact with other electrodes 22, for example interdigitated electrodes 22 disposed on a common side of component 20. One or more electrodes 22 can extend over and on either a top or bottom side, or both, of cantilever supports 50 onto frame 10 to electrically connect component 20 to micro-device 30. Bottom electrode 22B can pass through a via 14 (as shown in FIG. 4) and extend onto the top side of frame 10 or cantilever support 50.

Figure 2:
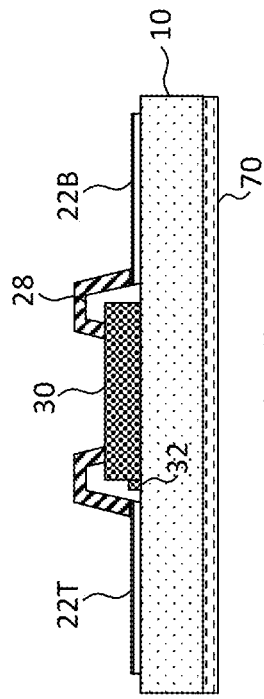
FIG. 2 is a cross section of an electrically functional micro-device taken across cross section line C of FIG. 1 disposed on and non-native to a frame according to illustrative embodiments of the present disclosure.

As shown in FIGS. 1 and 2, micro-device 30 can be non-native to and disposed on frame 10, for example by micro-transfer printing. For example, micro-device 30 can be constructed on or in, and therefore be native to, a micro-device source wafer such as a silicon source wafer and subsequently micro-transfer printed from the micro-device source wafer onto frame 10. Micro-device 30 can therefore comprise at least a portion of a device tether 32 (e.g., a broken (e.g., fractured) or separated device tether 32) once micro-transfer printed (e.g., as shown in FIG. 2). Micro-device 30 can be electrically connected to component 20 with one or more electrodes 22, for example disposed over dielectric structures 28 to electrically isolate micro-device 30 from electrodes 22 and frame 10.

Figure 3:
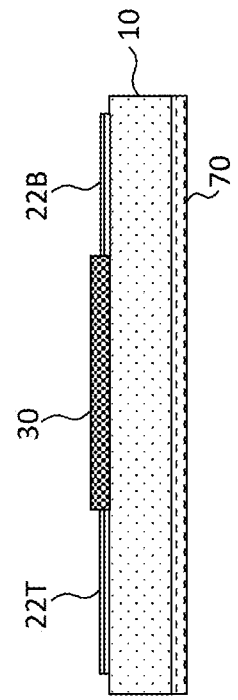
FIG. 3 is a cross section of an electrically functional micro-device native to and comprising at least a portion of a frame according to illustrative embodiments of the present disclosure.

According to some embodiments of the present disclosure and as shown in FIG. 3, electrically functional micro-device 30 is native to (e.g., formed on or in) frame 10. For example, frame 10 can comprise a layer of crystalline epitaxy, for example an epitaxial silicon layer, in which a circuit can be constructed using photolithographic processes. In some embodiments, a thin-film layer of semiconductor material (e.g., amorphous silicon, low-temperature polysilicon, or high-temperature polysilicon) can be coated and photolithographically processed to form a circuit. The circuit can be directly connected to component 20 through electrode 22 or indirectly connected to component 20 through other electrical elements (e.g., one or more active and/or passive electrical circuit elements, not shown).

Figure 4:
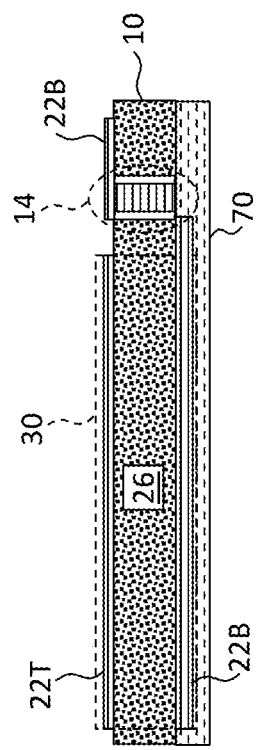
FIG. 4 is a cross section of a frame with an electrically functional micro-device taken across the lower portion of cross section line A of FIG. 1, the micro-device native to and constructed on or in or comprising at least a portion of the frame according to illustrative embodiments of the present disclosure.
Figure 14:
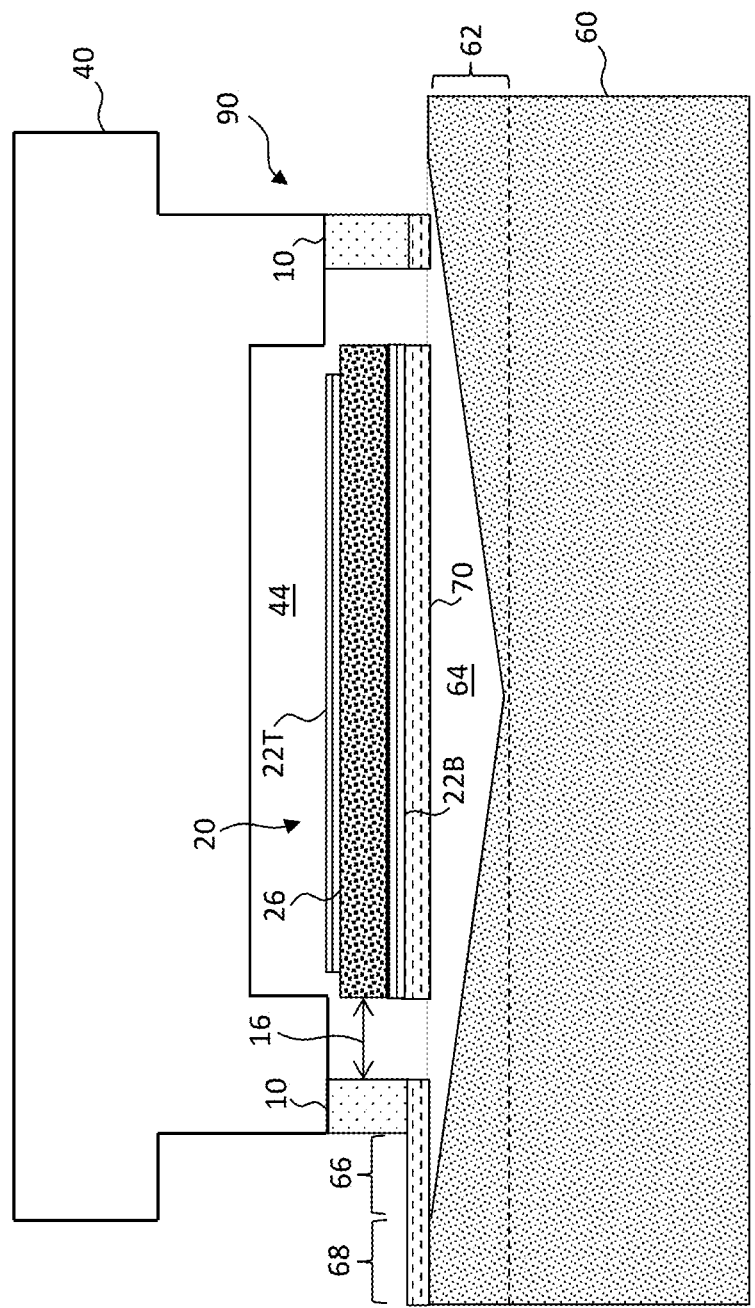
FIGS. 14 and 15 are cross sections of micro-transfer printing a micro-system taken across cross section line B of FIG. 1 from a source wafer with a stamp with a distal end post cavity onto a target substrate with a cavity according to illustrative embodiments of the present disclosure.
Figure 15:
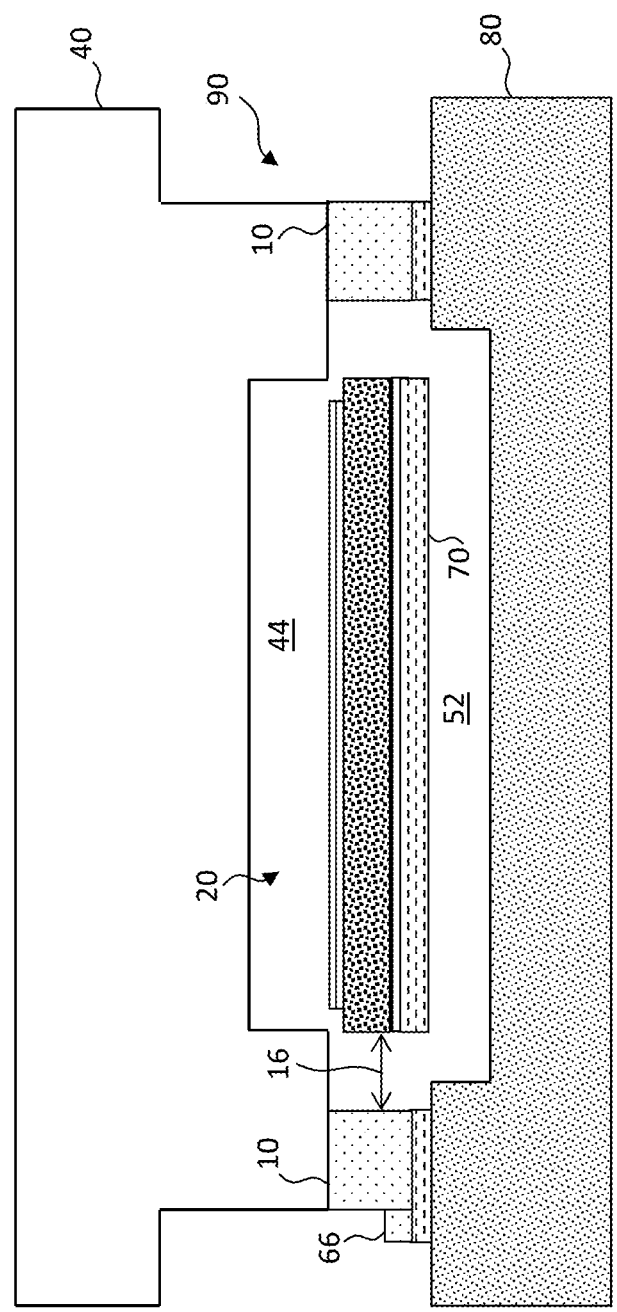

In some embodiments of the present disclosure and as shown in FIG. 4, two or more of electrically functional micro-device 30, frame 10, and component 20 comprise a same material or each comprises two or more layers that are the same layers disposed in a common order. In some embodiments, all three of electrically functional micro-device 30, frame 10, and component 20 each comprise a same material or each comprises two or more layers that are the same layers disposed in a common order. In some embodiments, all three are a common structure comprising the same material(s) and layer structure. In some embodiments, one or more of electrically functional micro-device 30, frame 10, and component 20 comprise an insulating, supporting, or etch-resistant etch-stop layer 70 as a bottom layer closest to a target substrate 80 (e.g., as shown in FIG. 15) or micro-system source wafer 90 (e.g., as shown in FIG. 14) over which electrically functional micro-device 30, frame 10, and component 20 are disposed once printed or prior to printing, respectively. Micro-device 30, frame 10, and component 20 each can comprise a three-layer stack of: a bottom electrode 22B, a component material 26 such as a piezoelectric material disposed directly on bottom electrode 22B or etch-stop layer 70, and a top electrode 22T disposed directly on component material 26. (In some embodiments, additional layer(s), such as a second layer of component material 26, can be included in the stack.) In some such embodiments, component material 26 is also a frame material and can be a micro-device material.

In some embodiments, electrically functional micro-device 30 comprises one or more capacitors formed in, comprising, or a part of frame 10. The capacitor can comprise at least a portion of bottom electrode 22B, at least a portion of component material 26 and, at least a portion of top electrode 22T. A piezoelectric micro-device 30 can comprise piezoelectric material with electrodes 22 disposed on either side of the piezoelectric material, but such a structure can also form an electrically responsive capacitor. As shown in FIG. 4, the one or more capacitors (micro-device 30) can form no less than 20%, 30%, 40%, 50%, 60%, 70%, or 80% of frame 10. In some embodiments, frame 10 is or comprises micro-device 30. In some embodiments, frame 10 is or comprises a capacitor.

In some embodiments of the present disclosure, electrically functional micro-device 30 controls or is responsive to component 20 or can be a portion of an electrical circuit that includes both micro-device 30 and component 20. For example, useful circuits can comprise a capacitor operational in combination with a piezoelectric acoustic resonator or filter.

According to some embodiments, in operation, an electronic circuit external to micro-system 90 provides signals (e.g., one or more of power, ground, and control signals) to micro-system 90. The signals are applied to micro-device 30 and component 20 by electrodes 22. The signals can cause component 20 to mechanically oscillate and produce (e.g., respond with) filtered signals that are further processed by micro-device 30 (e.g., as a capacitor providing a resonant circuit) providing a processed and filtered signal that is returned from micro-system 90.

Figure 5:
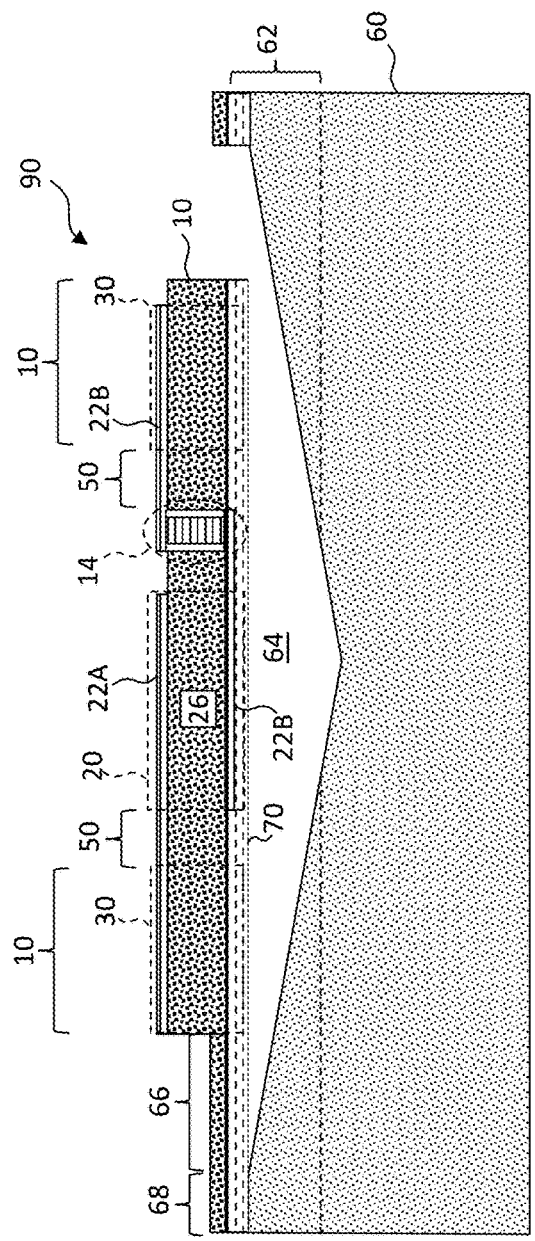
FIG. 5 is a cross section of a micro-system taken across cross section line A of FIG. 1 disposed on a sacrificial portion of a source wafer according to illustrative embodiments of the present disclosure.

In some embodiments of the present disclosure, frame 10 comprises at least a portion of a frame tether 66, for example a broken (e.g., fractured) or separated tether. Frame tether 66 can be a micro-system tether 66. For example, and as shown in FIG. 5, micro-system 90 can be disposed over a sacrificial portion 64 in a sacrificial layer 62 of a micro-system source wafer 60 and physically connected to an anchor 68 portion of micro-system source wafer 60 with frame tether 66.

Figure 6:
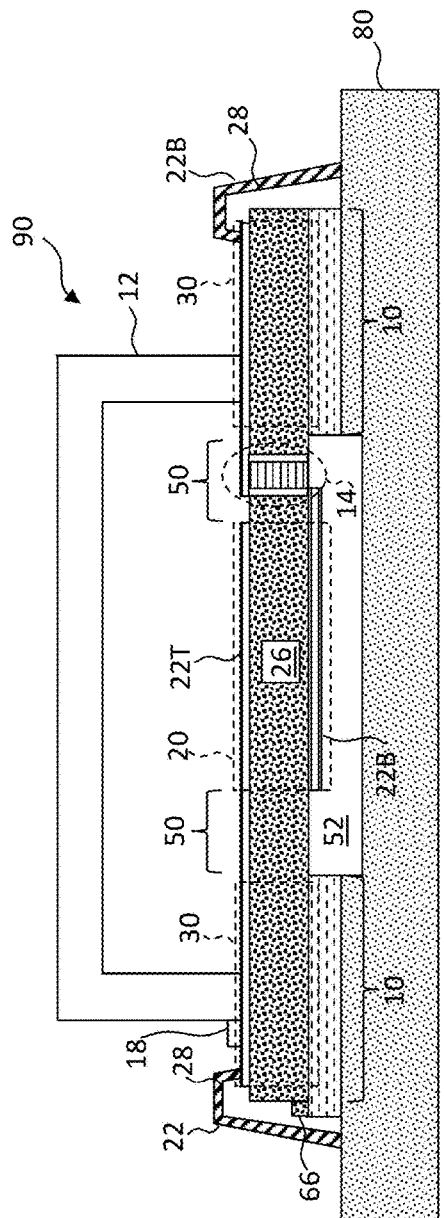
FIG. 6 is a cross section of a frame and component taken across cross section line A of FIG. 1 and an electrically functional micro-device that is at least a portion of a frame disposed on a target substrate over a cavity with a cap disposed on the frame according to illustrative embodiments of the present disclosure.

Micro-system 90 can be micro-transfer printed from micro-system source wafer 60 to a target substrate 80, as shown in FIG. 6. Thus, according to some embodiments of the present disclosure, a micro-system source wafer 60 comprises sacrificial layer 62. Sacrificial layer 62 comprises one or more sacrificial portions 64 adjacent to and separated by an anchor 68. A micro-system 90 is disposed entirely and directly over sacrificial portion 64. Sacrificial portion 64 can be etched to form a space between micro-system source wafer 60 and micro-system 90 so that micro-system 90 is attached to anchor 68 with frame tether 66 and suspended over the space. Micro-system 90 can then be micro-transfer printed from micro-system source wafer 60.

FIG. 6 illustrates micro-system 90 micro-transfer printed onto target substrate 80. Component 20 of micro-system 90 is disposed over a cavity 52 formed in target substrate 80 so that component 20 is not in direct physical contact with target substrate 80 and can mechanically move freely, for example resonate or vibrate. (In some embodiments, component 20 is suspended near a top side of frame 10 that has sufficient thickness such that component 20 can resonate or vibrate freely even without a cavity 52.) Frame tether 66 is a broken (e.g., fractured) or separated structure resulting from the micro-transfer printing process. Electrodes 22 are patterned over dielectric structures 28 that insulate electrodes 22 from micro-system 90 and can electrically connect component 20 and micro-device 30 to an external control or operational circuit, for example disposed on or in target substrate 80. In some embodiments, a cap 12 can be disposed on or over (e.g., and adhered) to frame 10 to protect component 20 and at least a portion of micro-device 30.

Embodiments of the present disclosure provide micro-systems 90 that are smaller and more integrated, comprising both MEMs structures (e.g., components 20) and circuits (e.g., micro-devices 30). Micro-device 30 can directly electrically interact with or control component 20 or component 20 can be part of a circuit that includes micro-device 30. Cap 12 can be micro-transfer printed from a cap source wafer and can comprise at least a portion of a cap tether 18 (e.g., a broken (e.g., fractured) or separated cap tether 18) as a consequence.

According to the present disclosure, micro-devices 30 can be provided in a variety of configurations and embodiments. As shown in the plan view of FIG. 7A and cross section of FIG. 7B taken across cross section line A of FIG. 7A, micro-system 90 can comprise multiple micro-devices 30 (e.g., two micro-devices 30A, 30B) each disposed on or in at least a portion of frame 10. One or more of multiple micro-devices 30 (e.g., two micro-devices 30A, 30B) can form at least a portion of frame 10 (frame 10 can comprise one or more of multiple micro-devices 30). The embodiments of FIG. 7A comprise two micro-devices 30, each disposed on, in, or comprising nearly but less than one half of frame 10. The two micro-devices 30A, 30B (collectively referred to as micro-devices 30) are separate micro-devices 30. The two micro-devices 30A, 30B can comprise a component material 26 with top and bottom electrodes 22T, 22B on the top and bottom sides of component material 26, respectively. Each top electrode 22T is connected from one end of corresponding micro-device 30A, 30B and bottom electrode 22B passes through via 14 and is connected at an other end of corresponding micro-device 30A, 30B.

Figure 8A:
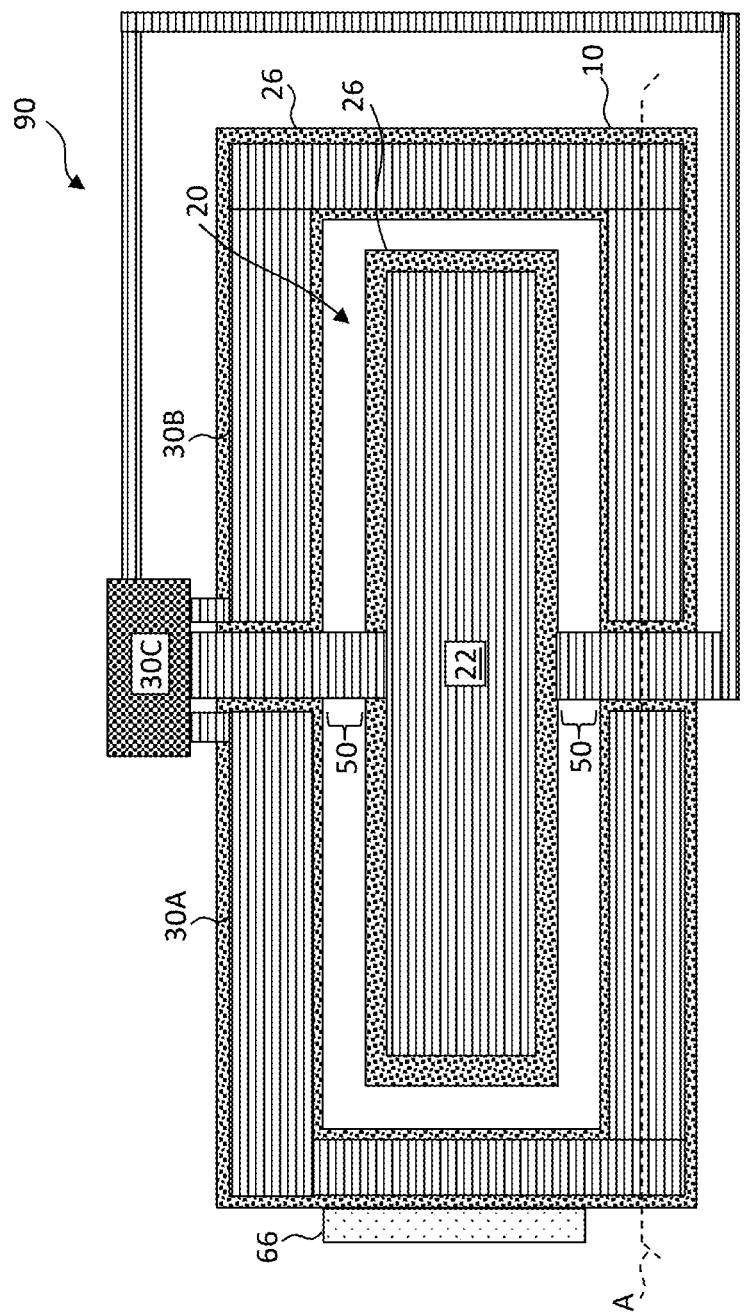
FIG. 8A is a plan view of a micro-system comprising a frame, two electrically functional micro-devices that are each a portion of the frame, and a micro-device external to the frame electrically connected to the component according to illustrative embodiments of the present disclosure.
Figure 8B:
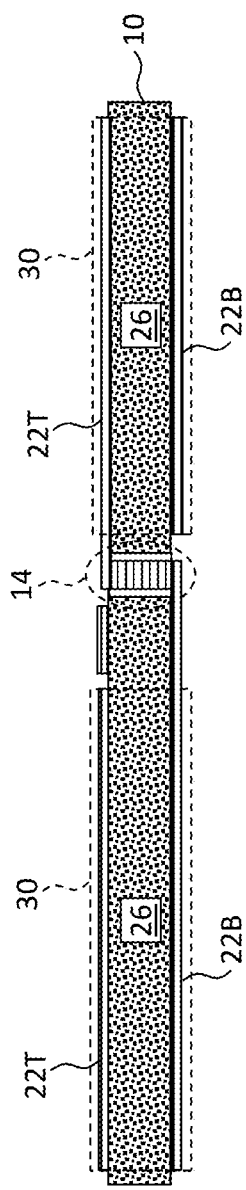
FIG. 8B is a cross section taken along cross section line A of FIG. 8A if the two electrically functional micro-devices that are each a portion of the frame are electrically connected in series according to illustrative embodiments of the present disclosure.
Figure 8C:
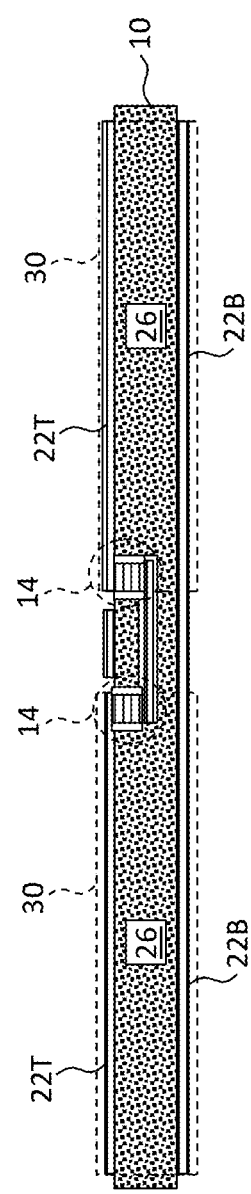
FIG. 8C is a cross section taken along cross section line A of FIG. 8A if the two electrically functional micro-devices that are each a portion of the frame are electrically connected in parallel according to illustrative embodiments of the present disclosure.

As shown in the embodiments of FIGS. 8A, 8B, and 8C, the two micro-devices 30A, 30B can be directly electrically connected to form a single electrically accessible micro-device 30. FIG. 8A illustrates is a plan view of component 20 supported by cantilever supports 50 and electrodes 22 on the top of component material 26. The FIG. 8B cross section taken along cross section line A of FIG. 8A illustrates embodiments in which micro-devices 30A and 30B are electrically serially connected and connected to micro-device 30C, for example a circuit for controlling or responding to micro-devices 30A and 30B and component 20. In some such embodiments, micro-devices 30A and 30B can be capacitors electrically connected in serial. The FIG. 8C cross section taken along cross section line A of FIG. 8A illustrates embodiments in which micro-devices 30A and 30B are electrically connected in parallel. In some such embodiments, micro-devices 30A and 30B can be capacitors electrically connected in parallel forming a single larger capacitor or micro-device 30.

Figure 9:
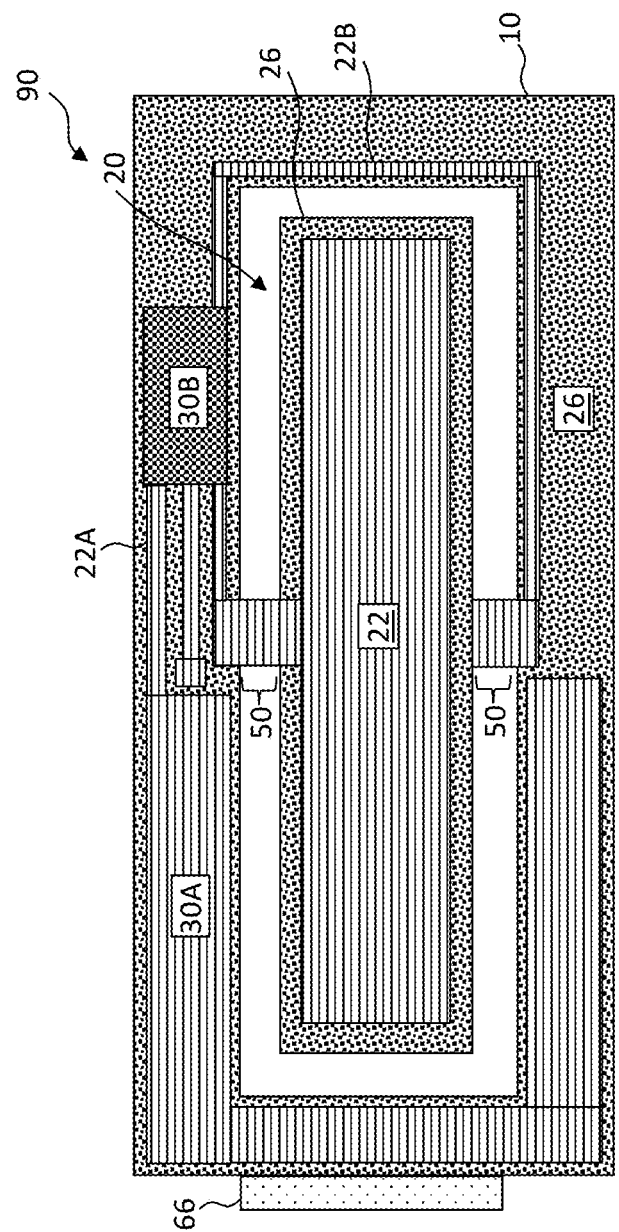
FIG. 9 is a plan view of a micro-system comprising a frame, an electrically functional micro-device that is more than 20% of the frame, and an electrically functional micro-device disposed on or in the frame connected to a component with electrodes disposed on the frame according to illustrative embodiments of the present disclosure.
Figure 10:
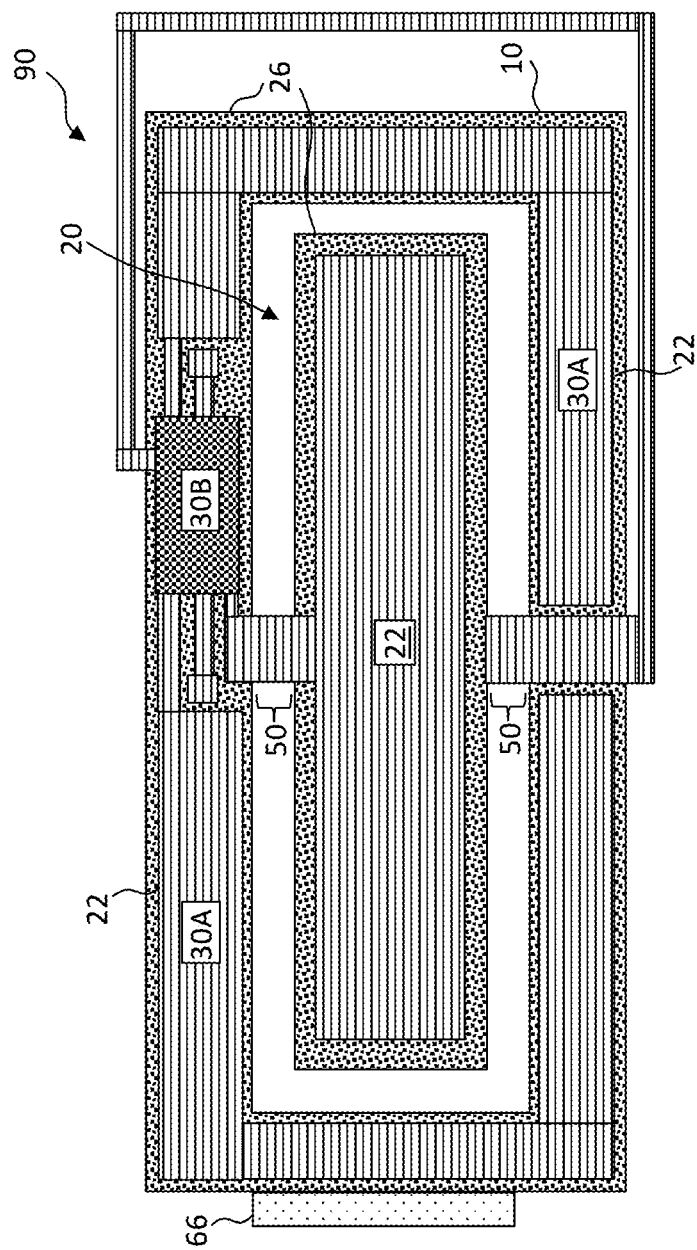
FIG. 10 is a plan view of a micro-system comprising a frame, two electrically functional micro-devices that are each more than 20% of the frame, and an electrically functional micro-device disposed on or in the frame externally connected to a component with an electrode external to the frame, for example on a target substrate, according to illustrative embodiments of the present disclosure.
Figure 11:
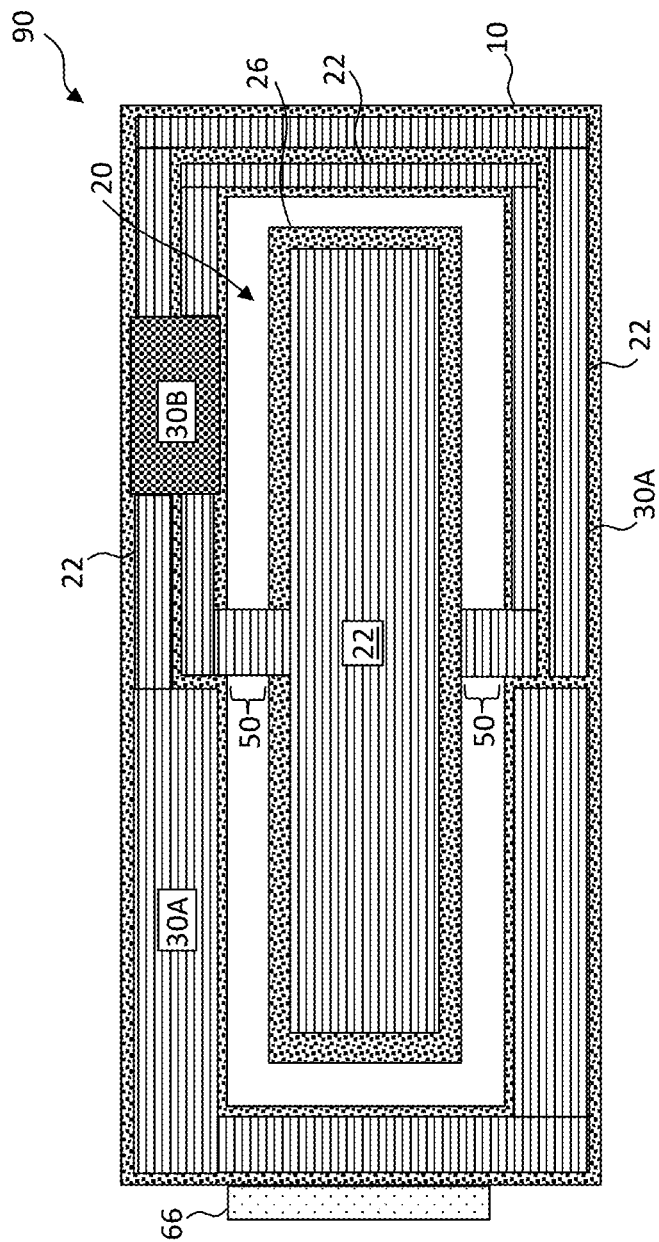
FIG. 11 is a plan view of a micro-system comprising a frame, two electrically functional micro-devices at least one of which is more than 20% of the frame, and an electrically functional micro-device disposed on or in the frame internally connected to a component with electrodes disposed on the frame according to illustrative embodiments of the present disclosure.

Some embodiments comprise different types of micro-devices 30 in one micro-system 90. For example, and as shown in FIG. 9, a micro-device 30A can be a capacitor directly or indirectly electrically connected to a different micro-device 30B that is a circuit. The circuit micro-device 30B can control or respond to the capacitor micro-device 30A in combination with component 20. FIG. 9 illustrates all of micro-devices 30 in micro-system 90 disposed on, in, or comprising at least portions of frame 10. FIG. 10 illustrates embodiments comprising electrical connections external to frame 10 connecting any one or more of: two capacitor micro-devices 30A, a circuit micro-device 30B, and component 20. FIG. 11 illustrates embodiments comprising electrical connections (e.g., electrodes 22) disposed on frame 10 connecting any one or more of: two capacitor micro-devices 30A, a circuit micro-device 30B, and component 20. One of micro-device 30A capacitors has a reduced area on frame 10 to accommodate the space needed on frame 10 for the electrical connections (electrodes 22) disposed on frame 10.

Figure 12:
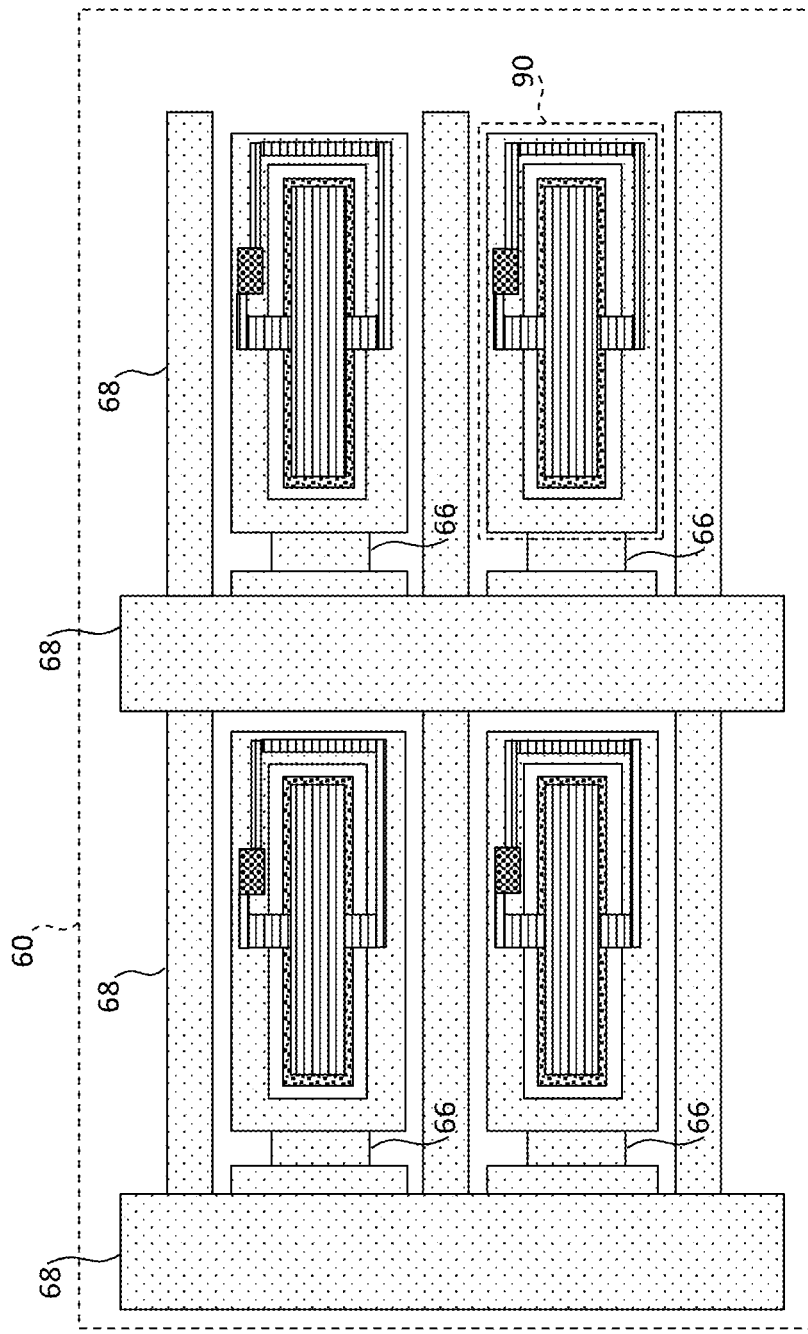
FIG. 12 is a plan view of multiple micro-systems on a micro-system source wafer according to illustrative embodiments of the present disclosure.

FIG. 12 illustrates a micro-system source wafer 60 with a 2 by 2 array of micro-systems 90 disposed over and attached to anchors 68 of micro-system source wafer 60 with frame tethers 66. Each micro-system 90 is connected to micro-system source wafer 60 with a respective frame tether 66.

Figure 13A:
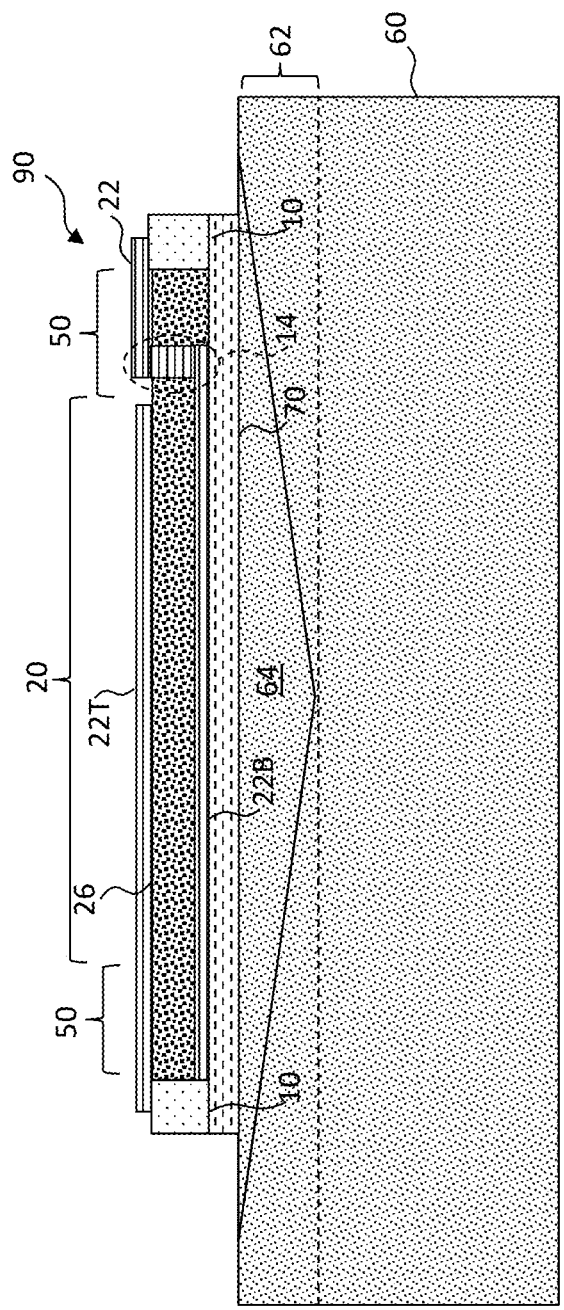
FIG. 13A is a cross section of a micro-system taken across cross section line A of FIG. 1 on a micro-system source wafer according to illustrative embodiments of the present disclosure.
Figure 13B:
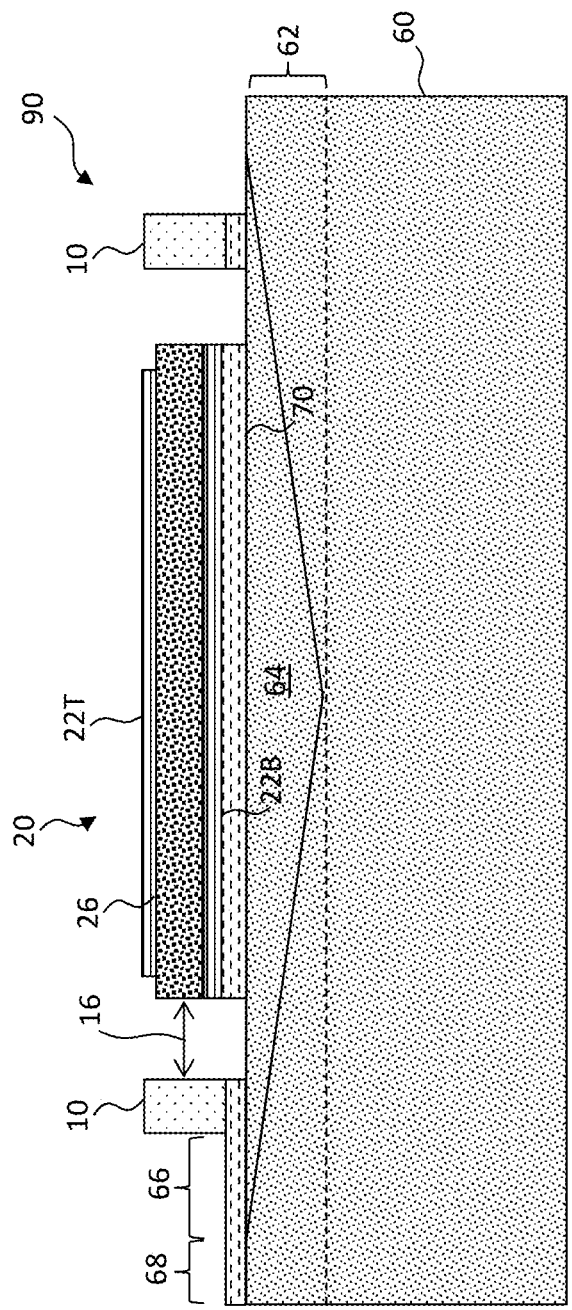
FIG. 13B is a cross section of a micro-system taken across cross section line B of FIG. 1 on a micro-system source wafer according to illustrative embodiments of the present disclosure.

According to embodiments of the present disclosure and as illustrated in the FIG. 13A cross section taken along cross section line A of FIG. 1 and FIG. 13B cross section taken along cross section line B of FIG. 1, micro-system 90 can be constructed on a micro-system source wafer 60 and micro-transfer printed to a target substrate 80. Micro-system source wafer 60 comprises a sacrificial layer 62 with sacrificial portions 64 separated by or adjacent to anchors 68. Etch-stop layer 70 is disposed over and patterned on sacrificial layer 62. Micro-system 90 is directly and entirely disposed over etch-stop layer 70 and sacrificial portion 64 and is physically connected to anchor 68 by frame tether 66. Frame tether 66 can comprise etch-stop layer 70 (a portion of etch-stop layer 70) but can comprise one or more other layers (e.g., made of other material(s)), such as encapsulation layer(s). Sacrificial portion 64 can be differentially etched with respect to etch-stop layer 70 to form an empty space and suspend micro-system 90 over the space (etched sacrificial portion 64) by frame tether 66, to enable micro-transfer printing micro-system 90 from micro-system source wafer 60.

As shown in FIG. 14, micro-system 90 can be micro-transfer printed with a stamp 40 from micro-system source wafer 60 to a target substrate 80 comprising a substrate cavity 52 so that component 20 is suspended over substrate cavity 52, as shown in FIG. 15. Micro-system 90 can be aligned with substrate cavity 52 when printing with stamp 40 so that component 20 is completely, directly, and entirely disposed over substrate cavity 52 and supported only by cantilever supports 50, as shown in FIG. 15 and FIG. 1. Thus, according to embodiments of the present disclosure, a micro-structure comprises a target substrate 80 comprising a substrate cavity 52 and a micro-system 90 disposed on (e.g., over) the target substrate 80 such that component 20 is disposed and suspended over substrate cavity 52. By providing component 20 suspended over substrate cavity 52 by cantilever support(s) 50, component 20 is free to mechanically move (e.g., vibrate or oscillate) without impinging on any other structures. In some embodiments, substrate cavity 52 provides a space (e.g., an air-filled gap, vacuum-filled gap, dry nitrogen-filled gap, or other spacing) between target substrate 80 and component 20.

Figure 16:
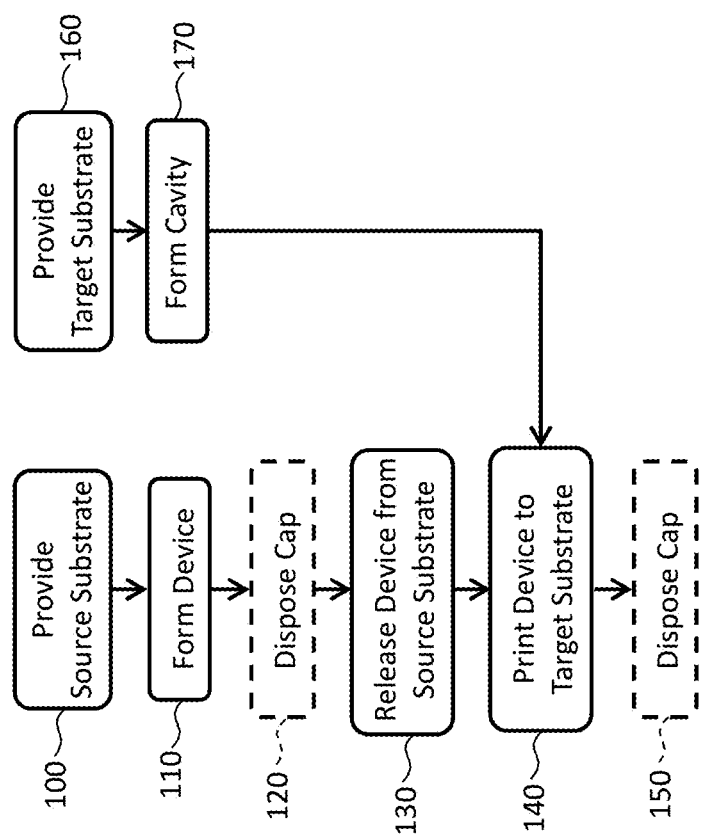
FIG. 16 is a flow diagram of methods according to illustrative embodiments of the present disclosure.

According to embodiments of the present disclosure, and as illustrated in the flow diagram of FIG. 16, micro-system 90 can be constructed in step 100 by first providing a micro-system source wafer 60 comprising a sacrificial layer 62 with sacrificial portions 64 separated by anchors 68. Micro-system source wafer 60 can be a semiconductor source wafer, for example a silicon source wafer. Etch-stop layer 70 is disposed over and patterned on sacrificial layer 62. Etch-stop layer 70 can be an insulator, for example a dielectric layer such as an oxide or nitride layer and micro-system source wafer 60 can be a semiconductor-on-insulator wafer. In step 110, micro-system 90 can be constructed directly and entirely over etch-stop layer 70 and sacrificial portion 64, for example by depositing and patterning layers of material using photolithographic methods and materials. An electrode 22 layer can be deposited (e.g., by evaporation or sputtering a metal) on etch-stop layer 70 directly over sacrificial portion 64 and patterned to form bottom electrode 22B. Bottom electrode 22B can be a portion of any one or more of: component 20, frame 10, and micro-device 30. A component material 26 layer can be deposited on bottom electrode 22B layer (e.g., by evaporation or sputtering a piezoelectric material such as KNN, AlN, or PZT or a semiconductor epitaxial layer) and patterned to form functional material, e.g., a portion of component 20, frame 10, or micro-device 30. An electrode 22 layer can be deposited (e.g., by evaporation or sputtering a metal) on component material 26 and patterned to form top electrode 22T and to complete component 20, frame 10, or micro-device 30.

Layer(s) of material used to form component 20 can also form cantilever support 50 and frame 10. In some embodiments, different materials are deposited and patterned to form cantilever support 50 and frame 10. For example, frame 10 can comprise patterned dielectric structures 28 on which micro-device electrodes 22 are deposited and patterned. In some embodiments, bottom electrode 22B is omitted and multiple (e.g., two) top electrodes 22T are patterned on component material 26 and each top electrode 22T can be extended over a corresponding cantilever support 50 onto frame 10.

In some embodiments, an epitaxial layer is disposed and patterned on frame 10. If desired, a native micro-device 30 can be formed on or in the epitaxial layer (e.g., a semiconductor layer). In some embodiments, a non-native micro-device 30 can be disposed on frame 10, for example by micro-transfer printing. Photolithographic processes can be performed on frame 10, micro-device 30, and component 20 to form electrodes 22 electrically connecting micro-device 30 and component 20.

Optionally, a cap 12 covering component 20 is disposed on frame 10 (or otherwise over component 20) in optional step 120, for example by micro-transfer printing, and can comprise a broken (e.g., fractured) or separated cap tether 18 as a consequence of micro-transfer printing.

In step 130, micro-system 90 is released from micro-system source wafer 60 by etching sacrificial portion 64 with an etchant through openings in etch-stop layer 70 exposing sacrificial portion 64. After release, micro-system 90 is suspended over micro-system source wafer 60 by one or more frame tethers 66 connected to micro-system 90 and anchor 68, for example as shown in FIG. 5.

A target substrate 80 is provided in step 160 and patterned with a substrate cavity 52 in step 170, for example by etching through a patterned photoresist layer and then stripping the photoresist using photolithographic methods and materials. Target substrate 80 can be any suitable substrate, including a semiconductor, glass, ceramic, or polymer substrate.

Figure 17:
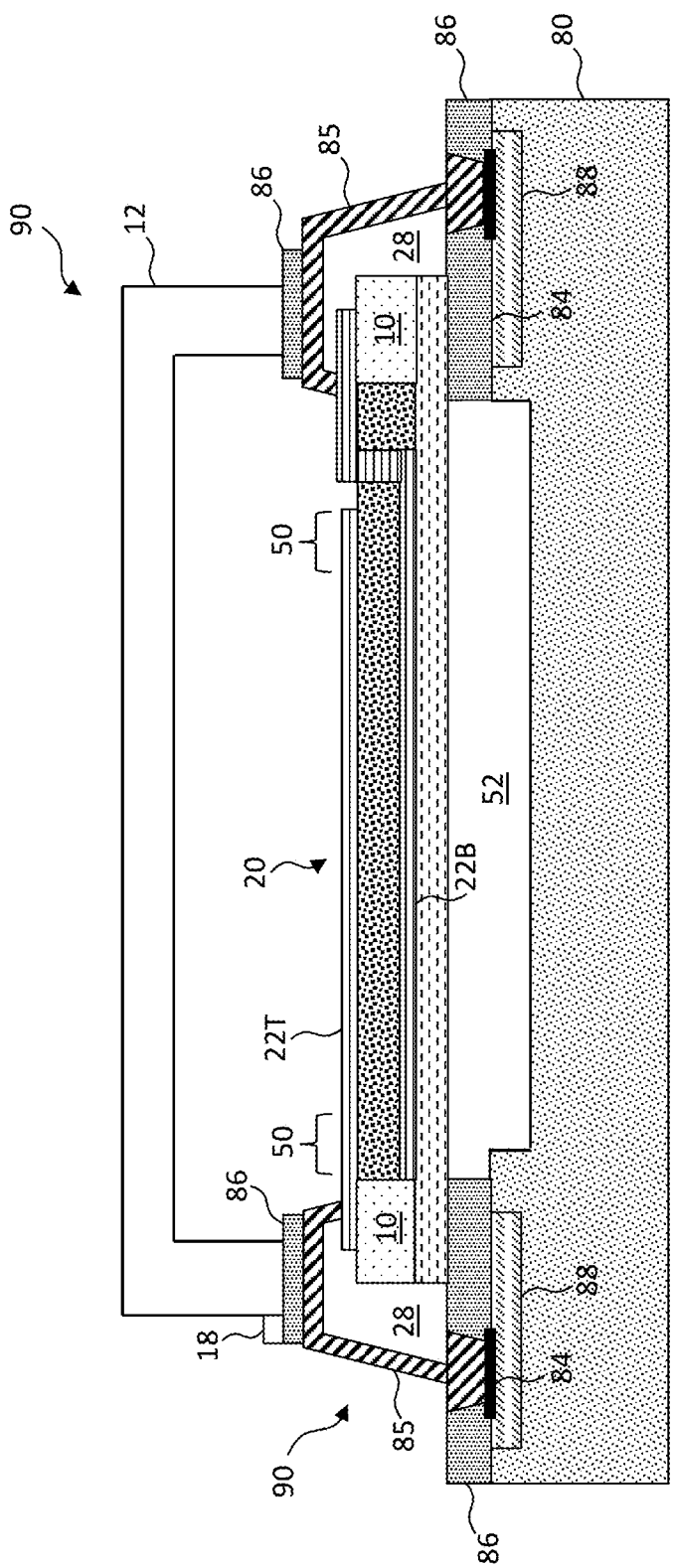
FIG. 17 is a cross section of a micro-system taken along cross section line A of FIG. 1 micro-transfer printed onto a target substrate with a cap and electrically connected electrodes according to illustrative embodiments of the present disclosure.

In step 140, micro-system 90 can be micro-transfer printed with a stamp 40 from micro-system source wafer 60, as shown in FIGS. 14 and 15, to target substrate 80 over substrate cavity 52, as shown in FIG. 17, so that component 20 is suspended over substrate cavity 52. Electrodes 22 can be electrically connected to substrate contact pads 84 using photolithographic methods and materials and cap 12 optionally disposed on and adhered to frame 10 (as shown in FIG. 6) or target substrate 80 (as shown in FIG. 17) in optional step 150. Micro-system 90 can then be operated by providing electrical control signals through substrate contact pads 84, substrate electrodes 85, and micro-device electrodes 22 to component 20, for example with a substrate circuit 88 native to target substrate 80 or a substrate circuit 88 disposed on or in target substrate 80, for example by photolithographic processing or by micro-transfer printing.

Figure 18:
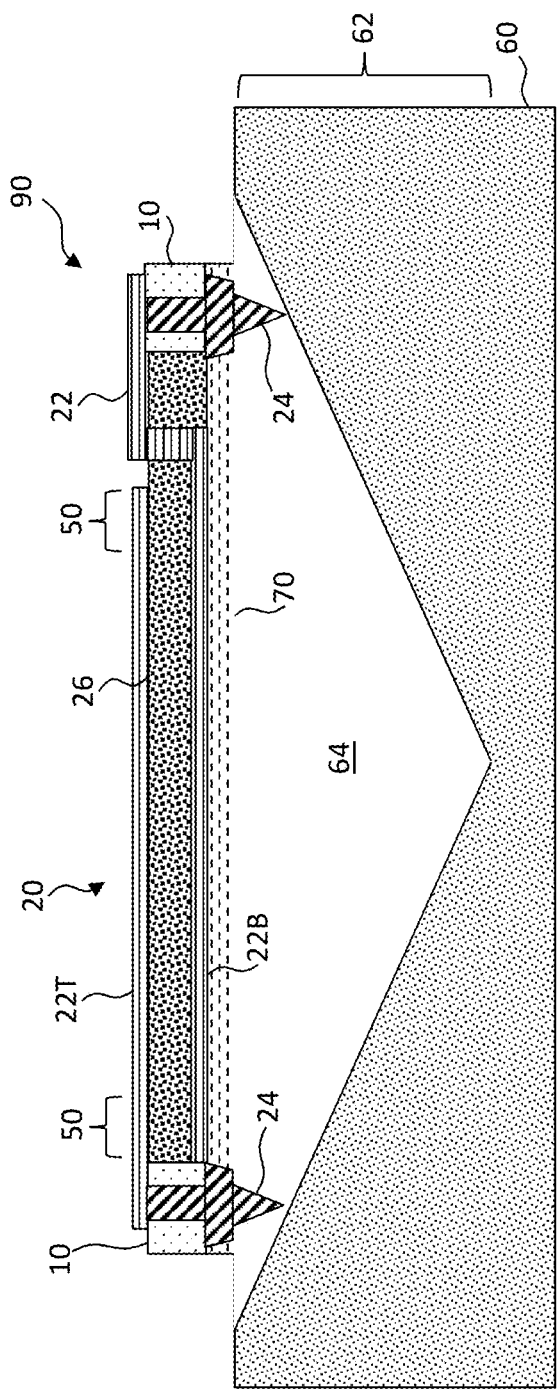
FIG. 18 is a cross section of a micro-system source wafer and released micro-system with connection posts taken along cross section line A of FIG. 1 according to illustrative embodiments of the present disclosure.
Figure 19:
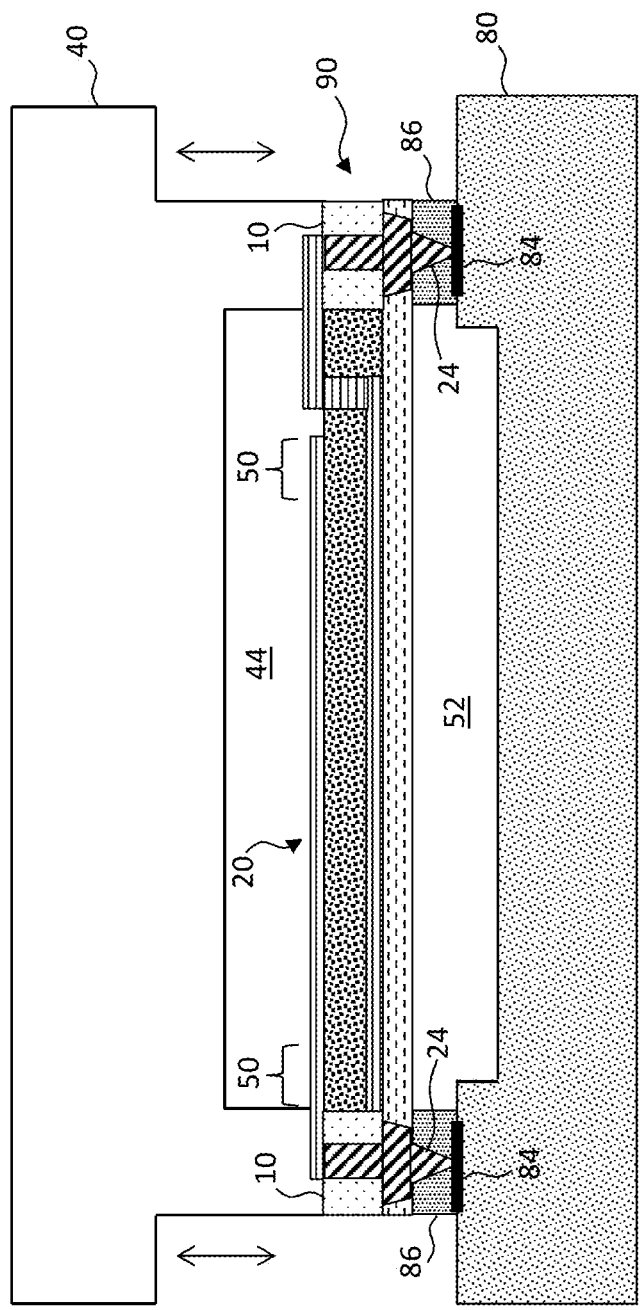
FIG. 19 is a cross section of a micro-system with connection posts according to FIG. 18 micro-transfer printed onto a target substrate according to illustrative embodiments of the present disclosure.

In some embodiments of the present disclosure, micro-systems 90 are electrically connected to substrate electrodes 85, contact pads 84, or substrate circuit 88 using photolithographically defined substrate electrodes 85 disposed over dielectric structures 28. In some embodiments, frames 10 can comprise connection posts 24 formed in pyramidal depressions extending from etch-stop layer 70 in sacrificial portions 64 that are electrically connected to micro-device electrodes 22, for example through a via 14 in etch-stop layer 70 and frame 10. Methods of making and connecting connection posts 24 are described at length in U.S. Pat. No. 10,468,363, entitled Chiplets with Connection Posts. After sacrificial portion 64 is etched to release micro-system 90 from micro-system source wafer 60 (e.g., in step 130), connection posts 24 extend into the space formed by etched sacrificial portion 64, for example as shown in FIG. 18. When micro-system 90 is micro-transfer printed from micro-system source wafer 60 to target substrate 80, connection posts 24 can be aligned with and pressed into or through contact pads 84 on target substrate 80 to form an electrical connection between connection posts 24 and contact pads 84 without any additional photolithographic processing, reducing manufacturing steps and costs, for example as shown in FIG. 19.

Figure 20:
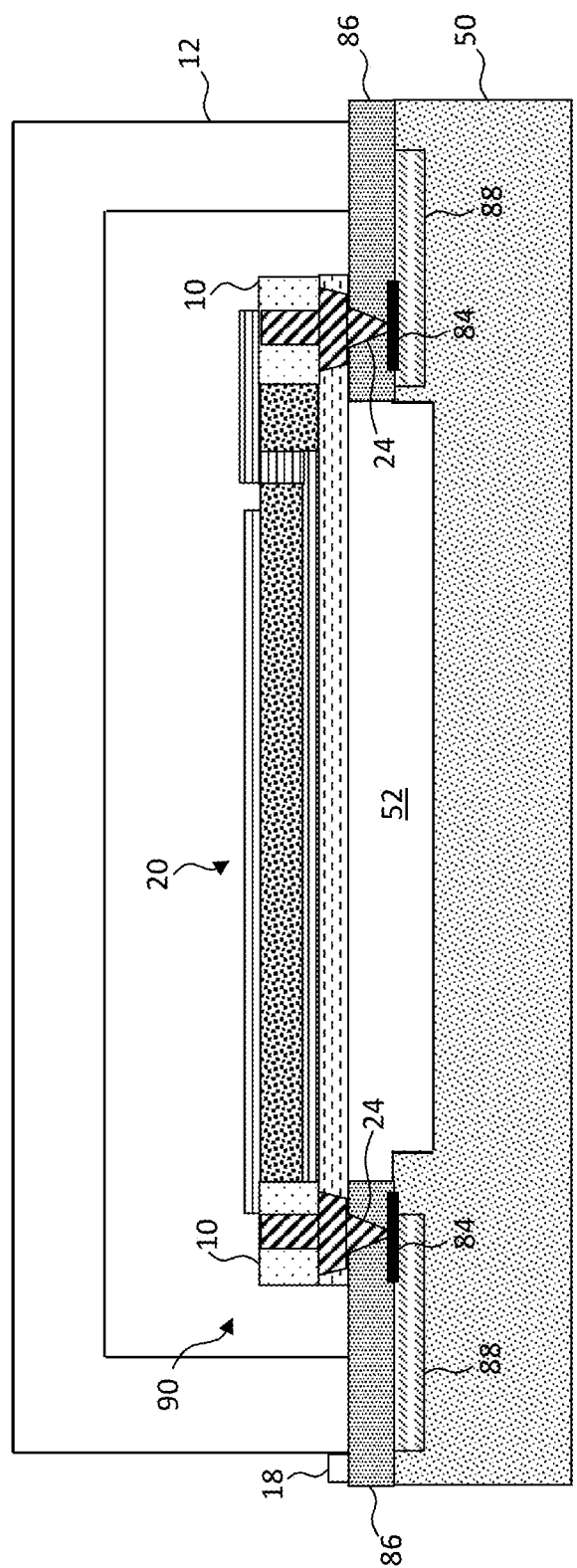
FIG. 20 is a cross section of a micro-system with connection posts according to FIG. 18 micro-transfer printed onto a target substrate with a cap according to illustrative embodiments of the present disclosure.

According to some embodiments, micro-system 90 is micro-transfer printed onto target substrate 80 without an adhesive layer adhering micro-system 90 to target substrate 80. In some embodiments, micro-system 90 is adhered to target substrate 80 with a layer of adhesive 86, for example as shown in FIG. 20. A curable adhesive 86 can be disposed on target substrate 80, for example by spray, spin, or slot coating the layer of adhesive 86. The layer of adhesive 86 can be patterned, for example removed from target substrate 80 except between frame 10 and target substrate 80. As micro-system 90 is disposed on target substrate 80 with stamp 40 (e.g., as in step 140 and FIG. 19), frame 10 contacts adhesive 86 and is adhered to target substrate 80, for example as shown in FIGS. 17, 19, and 20. If micro-system 90 comprises connection posts 24, connection posts 24 can be forced through adhesive 86 into contact with contact pads 84 in step 140. When adhesive 86 is cured, it shrinks somewhat and pulls micro-system 90 toward target substrate 80 and, if present, forces connection posts 24 into or through contact pads 84, creating a firm electrical connection. If micro-system 90 does not comprise connection posts 24, electrical connections between target substrate 80 and micro-system 90 can be made, for example, using conventional photolithographic methods and materials, e.g., as shown in FIG. 17. Adhesive 86 can also be used to adhere cap 12 to either frame 10 (e.g., as shown in FIG. 17) or target substrate 80 (e.g., as shown in FIG. 20).

According to embodiments of the present disclosure, components 20 are suspended by cantilever support(s) 50 and are not otherwise in contact with any other structure, for example not in contact with an underlying substrate, e.g., target substrate 80, (in contrast to conventional solidly mounted bulk acoustic resonators). Thus, components 20 cannot be transferred directly from a micro-system source wafer 60 onto a target substrate 80 but rather require a supporting structure (e.g., frame 10) to suspend components 20 and enable micro-systems 90 transfer to a target substrate 80 and operation on target substrate 80, optionally over a substrate cavity 52 in target substrate 80 that enables component 20 operation and support exclusively by frame 10. Thus, frame 10 provides structural support to component 20 and also can enable micro-transfer printing of micro-system 90.

Figure 21:
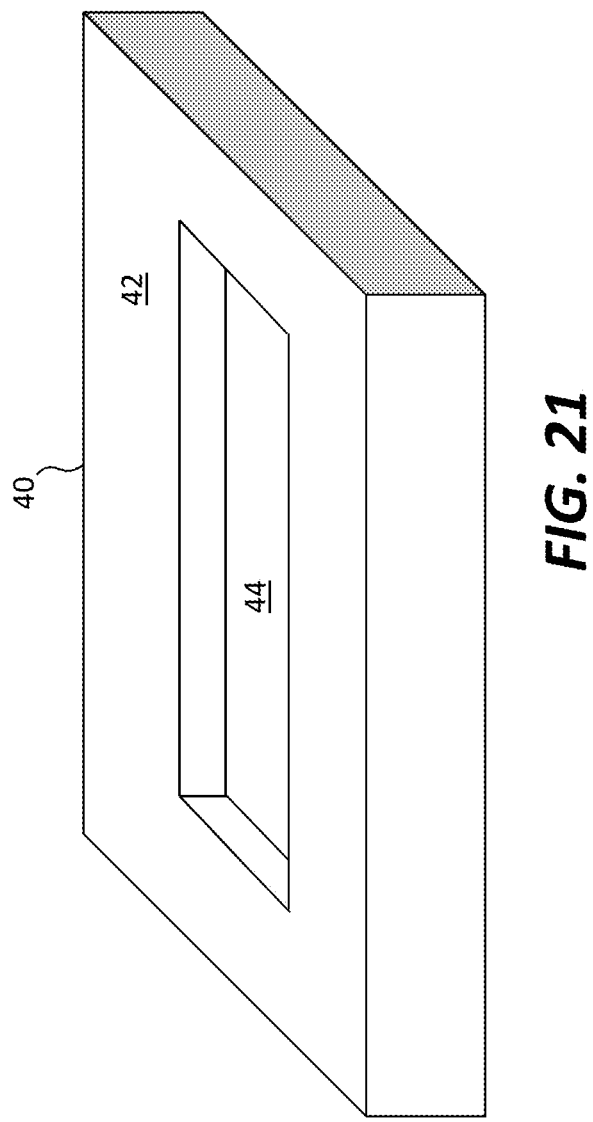
FIG. 21 is a perspective of the distal end of a stamp post according to illustrative embodiments of the present disclosure.

Micro-transfer printing uses a stamp 40 in contact with micro-system 90 to remove micro-system 90 from a micro-system source wafer 60 and transfer micro-system 90 to a target substrate 80. Since component 20 can be fragile and connected to frame 10 only by cantilever support(s) 50, a stamp 40 in contact with component 20 can break cantilever supports 50. Stamp 40 can have post with a distal end 42 having a shape corresponding to frame 10 and with a stamp opening 44 (e.g., a stamp cavity 44 in distal end 42 of stamp 40 post) corresponding to frame 10 and component 20 to avoid contacting component 20 and breaking cantilever supports 50 during the micro-transfer printing process as shown in FIG. 21 (and also in FIGS. 14, 15 and 19). (FIG. 11 shows stamp 40 upside-down with respect to FIGS. 14, 15, and 19.)

Component 20 can be a micro-component with one or more dimensions less than one mm. According to some embodiments of the present disclosure, component 20 can comprise a component material 26, (e.g., a piezoelectric material) and one or more electrodes 22 disposed on one or more sides of component material 26. Electrodes 22 can extend from component 20 over cantilever supports 50 onto frame 10. A micro-device electrode 22 can be disposed on a top (top electrode 22T) and a bottom (bottom electrode 22B) of component material 26 or electrodes 22 can be patterned on one side of the material. Bottom electrode 22B can pass through a via 14 in component material 26 and extend onto a top side of cantilever support 50 and frame 10 and micro-device 30. Top and bottom are arbitrary designations but can refer to opposite sides of a structure such as component 20. A top side can be a side of frame 10 or component 20 that is opposite micro-system source wafer 60 or target substrate 80 and a bottom side can be a side of frame 10 or component 20 that is adjacent to micro-system source wafer 60 or target substrate 80.

Micro-device electrodes 22 on frame 10 can provide electrical connections to external electronic circuits to electrically control or respond to component 20 or micro-device 30, or both. According to some embodiments, multiple different electrodes 22 can be disposed on a side of component 20, for example interdigitated micro-device electrodes 22 on a top side of component 20 and as shown in U.S. patent application Ser. No. 17/027,671, whose contents are incorporated by reference herein in its entirety.

According to some embodiments, frame 10 can comprise one or more of the materials comprising component 20, e.g., component material 26, micro-device electrodes 22 (e.g., a metal) or other materials including oxides such as silicon dioxide or nitrides such as silicon nitride. According to some embodiments, frame 10 or micro-system 90 is micro-transfer printable or micro-transfer printed and comprises a frame tether 66 or a fractured (e.g., broken) or separated frame tether 66. Frame tether 66 can comprise one or more of component material 26, dielectric materials such as an oxide or nitride in various combinations, metals, a photoresist, an encapsulating layer, or an etch-stop layer 70.

According to embodiments of the present disclosure, micro-system 90, component 20, micro-device 30, or frame 10, or a combination thereof, can be a microscopic structure with external dimensions of, independently, less than 1 mm in length or width, or both, and, optionally, a thickness no greater than 1 mm. For example, micro-system 90, component 20, micro-device 30, or frame 10, or a combination thereof, can have a length of no greater than 500 µm, no greater than 300 µm, no greater than 200 µm, no greater than 100 µm, no greater than 50 µm, or no greater than 20 µm. In some embodiments, component 20, micro-device 30, or frame 10, or a combination thereof, can each be a microscopic structure with external dimensions of, independently, less than 500 µm in length or width, or both, and, optionally, a thickness no greater than 500 µm. For example, component 20, micro-device 30, or frame 10, or a combination thereof, can each have a length of no greater than 500 µm, (e.g., no greater than 300 µm, no greater than 200 µm, no greater than 100 µm, no greater than 50 µm, no greater than 10 µm, no greater than 5 µm, or no greater than 20 µm). In some embodiments, component 20, micro-device 30, or frame 10, or a combination thereof, can each have a length in the range of 200-300 µm, for example 270-280 µm. In some embodiments, frame 10 can have external dimensions with a length or width that is substantially the same as micro-system 90 (e.g., disregarding any broken or separated tether that protrudes from frame 10, if present). In some embodiments, frame 10 has a length in the range of 400-500 µm, for example 430-450 µm and a width in the range of 250-350 µm, for example 275-285 µm. Micro-system 90, component 20, micro-device 30, or frame 10, or a combination thereof, can have a thickness no greater than 100 µm (e.g., no greater than 50 µm, no greater than 20 µm, no greater than 10 µm, no greater than 5 µm, or no greater than 2 µm, for example in the range of 1-5 µm).

Component 20 can be any structure useful in combination with frame 10, for example an active or passive electronic device suspended from frame 10, for example over substrate cavity 52. Component 20 can be an electrically responsive device such as a micro-electromechanical device and can comprise piezoelectric material and micro-device electrodes 22. Component 20 can be an acoustic filter or acoustic resonator. Component 20 can comprise piezoelectric material such as KNN, AlN, or PZT or a semiconductor epitaxial layer, dielectrics such as silicon oxides and nitrides, and electrically conductive materials such as metals. Component electrodes 22 can be patterned and disposed on a top and bottom of component 20 or only one side, for example the top side opposite substrate cavity 52.

Micro-device 30 can be any structure useful in combination with component 20, for example an active or passive device disposed on or in frame 10. Micro-device 30 can be an electrically responsive device such as a silicon device or can comprise piezoelectric material electrically connected with electrodes 22. Micro-device 30 can be capacitor. Micro-device 30 can comprise piezoelectric material such as KNN, AlN, or PZT or a semiconductor epitaxial layer, dielectrics such as silicon oxides and nitrides, and electrically conductive materials such as metals. Electrodes 22 can be patterned and disposed on a top and bottom of micro-device 30 or electrically connected to micro-device 30.

Component 20, micro-device 30, and frame 10 can comprise any one or more of a combination of semiconductor, conductive metals, or dielectric materials, such as inorganic oxides (e.g., silicon oxide), nitrides (e.g., silicon nitride), or organic materials such as photoresists, resins or epoxies. Component 20, micro-device 30, and frame 10 can be constructed using photolithographic methods and materials known in the art. Target substrate 80 can be any useful substrate on or in which micro-system 90 can be disposed or formed, for example glass, polymer, semiconductor, or compound semiconductor materials as found in the integrated circuit industry. Component 20, micro-device 30, and frame 10 can be coated or encapsulated, for example with an organic (e.g., a resin) or inorganic (e.g., an oxide or nitride) dielectric. Cantilever supports 50 can have a width or length less than one third of a width or length of component 20, respectively, for example having a width and length of 50 by 25 µm. Gaps 16 can have a width from one quarter to four times the width or length of component 20, for example 10-30 µm or 20 µm.

Substrate circuit 88 can be disposed in or on target substrate 80, for example native to and constructed on a semiconductor target substrate 80 or micro-transfer printed and non-native to target substrate 80 and can control, respond to, or interact with micro-system 90, for example with component 20. Multiple micro-systems 90 controlled by substrate circuit 88 can be disposed on target substrate 80.

If substrate circuit 88 is native to and formed in or on target substrate 80, compound semiconductor substrate materials are useful because they can provide semiconductor materials useful in high-frequency electronic circuits, for example GaAs, GaN, InP and other III/V or II/VI compound semiconductor materials. If substrate circuit 88 is not native to target substrate 80, substrate circuit 88 can be an integrated circuit formed in a source wafer and disposed on target substrate 80 as a bare unpackaged die, for example by micro-transfer printing, and substrate circuit 88 can comprise a broken (e.g., fractured) or separated frame tether 66 in consequence. Substrate circuit 88 can be an integrated circuit formed using photolithographic methods and materials known in the art.

Substrate electrodes 85 can be, comprise, or electrically connect to an electrical substrate contact pad 84. Micro-device electrodes 22 can electrically connect to substrate electrodes 85 or substrate contact pads 84. Micro-systems 90 can comprise electrically conductive connection posts 24 that extend (e.g., protrude) from a bottom side of frame 10 toward target substrate 80 in electrical contact with substrate electrode 85 or substrate contact pad 84. Connection posts 24 can contact or pierce substrate electrode 85 or substrate contact pad 84 to make an electrical connection and substrate electrode 85 or substrate contact pad 84 can be electrically connected to substrate circuit 88, for example with wires or metal traces, thus connecting any circuit in micro-system 90 or component 20 with substrate circuit 88. Substrate electrodes 85 or substrate contact pads 84 can be metal or other electrical conductors and can be formed using photolithographic materials and methods known in the art.

Connection posts 24 can be pyramidal or have a triangular cross section and have a sharp point. Connection posts 24 can be coated metal over a dielectric structure 28 and can be connected with vias 14 (for example through-silicon or through-dielectric vias 14) through frame 10 to a substrate circuit 88.

Micro-system 90 can be disposed on target substrate 80 by micro-transfer printing micro-system 90 from a micro-system source wafer 60. In consequence of micro-transfer printing, micro-system 90 can comprise a broken (e.g., fractured) or separated frame tether 66.

Reference is made throughout the present description to examples of micro-transfer printing with stamp 40 when describing certain examples of printing micro-systems 90. Similar other embodiments are expressly contemplated where a transfer device that is not a stamp 40 is used to similarly print micro-systems 90. For example, in some embodiments, a transfer device that is a vacuum-based or electrostatic transfer device can be used to print micro-systems 90. A vacuum-based or electrostatic transfer device can comprise a plurality of transfer posts, each transfer post being constructed and arranged to pick up a single micro-system 90 (similarly to posts in stamp 40).

According to some embodiments, micro-transfer printing can include any method of transferring micro-systems 90 from a source wafer (e.g., micro-system source wafer 60) to a destination substrate (e.g., target substrate 80) by contacting micro-systems 90 on micro-system source wafer 60 with a patterned or unpatterned stamp surface of a stamp 40 to remove micro-systems 90 from micro-system source wafer 60, transferring stamp 40 and contacted micro-systems 90 to target substrate 80, and contacting micro-systems 90 to a surface of target substrate 80. Micro-systems 90 can be adhered to stamp 40 or target substrate 80 by, for example, van der Waals forces, electrostatic forces, magnetic forces, chemical forces, adhesives, or any combination of the above. In some embodiments, micro-systems 90 are adhered to stamp 40 with separation-rate-dependent adhesion, for example kinetic control of viscoelastic stamp materials such as can be found in elastomeric transfer devices such as a PDMS stamp 40. Stamps 40 can be patterned or unpatterned and can comprise stamp 40 posts having a post area on distal end 42 of stamp 40 posts. Distal end 42 of stamp 40 posts can be structured. Stamp 40 posts can have a length, a width, or both a length and a width, similar or substantially equal to a length, a width, or both a length and a width of frame 10 and can have a shape corresponding to frame 10. In some embodiments, distal end 42 of stamp 40 posts can have a shape similar to frame 10, for example as shown in FIG. 21. In some embodiments, stamp 40 posts each have a contact surface of substantially identical area.

In exemplary methods, a viscoelastic elastomer (e.g., PDMS) stamp 40 (e.g., comprising a plurality of stamp 40 posts) is constructed and arranged to retrieve and transfer micro-systems 90 from their native micro-system source wafer 60 onto non-native target substrates 80. In some embodiments, stamp 40 mounts onto motion-plus-optics machinery (e.g., an opto-mechatronic motion platform) that can precisely control stamp 40 alignment and kinetics with respect to both micro-system source wafers 60 and target substrates 80. During micro-transfer printing, the motion platform brings stamp 40 into contact with micro-systems 90 on micro-system source wafer 60, with optical alignment performed before contact. Rapid upward movement of the print-head (or, in some embodiments, downward movement of micro-system source wafer 60) breaks (e.g., fractures) or separates frame tether(s) 66 forming broken (e.g., fractured) or separated frame tethers 66, transferring micro-systems 90 to stamp 40 or stamp 40 posts. The populated stamp 40 then travels to target substrate 80 (or vice versa) and one or more micro-systems 90 are then aligned to substrate cavities 52 in target substrate 80 and printed.

Sacrificial portions 64 are sacrificed, for example by etching sacrificial portions 64 to form a space between etch-stop layer 70 and micro-system source wafer 60, so that micro-systems 90 are suspended over micro-system source wafer 60 and attached to anchors 68 of micro-system source wafer 60 by frame tethers 66 that maintain the physical position of micro-systems 90 relative to (e.g., with respect to) micro-system source wafer 60 after sacrificial portions 64 are etched. (Micro-systems 90 are said to comprise at least a portion of a frame tether 66, which may break or separate during a pick-up portion of a print step.) Stamp 40 is moved into position relative to micro-system source wafer 60, for example by an opto-mechatronic motion platform and micro-systems 90 are picked up from micro-system source wafer 60 by adhering micro-systems 90 to stamp 40, for example by pressing stamp 40 against frames 10 on micro-system source wafer 60 with the motion platform and adhering micro-systems 90 to distal ends 42 of stamp 40 posts, for example with van der Waals or electrostatic forces.

A micro-system source wafer 60 can be any source wafer or substrate with transfer printable micro-systems 90 that can be transferred with a transfer device (e.g., a stamp 40). For example, a micro-system source wafer 60 can be or comprise a semiconductor (e.g., silicon) in a crystalline or non-crystalline form, a compound semiconductor (e.g., comprising GaN or GaAs), a glass, a polymer, a sapphire, or a quartz wafer. Sacrificial portions 64 can be formed of a patterned oxide (e.g., silicon dioxide) or nitride (e.g., silicon nitride) layer or can be an anisotropically etchable portion of sacrificial layer 62 of micro-system source wafer 60. Typically, micro-system source wafers 60 are smaller than target substrates 80.

Micro-systems 90 can be unpackaged dice (each an unpackaged die) transferred directly from native micro-system source wafers 60 on or in which micro-systems 90 are constructed to target substrate 80.

Anchors 68 and frame tethers 66 can each be or can comprise portions of micro-system source wafer 60 that are not sacrificial portions 64 and can include layers formed on micro-system source wafers 60 or micro-systems 90, for example dielectric or metal layers and for example layers formed as a part of photolithographic processes used to construct micro-systems 90.

Target substrate 80 can be any destination substrate or target substrate 80 to which micro-systems 90 are transferred (e.g., micro-transfer printed), for example flat-panel display substrates, printed circuit boards, or similar substrates can be used in various embodiments. Target substrates 80 can be semiconductor substrates (for example silicon) or compound semiconductor substrates. In certain embodiments, target substrate 80 is or comprises a member selected from the group consisting of polymer (e.g., plastic, polyimide, PEN, or PET), resin, metal (e.g., metal foil) glass, ceramic, quartz, and sapphire. In certain embodiments, target substrate 80 has a thickness from 5 μm to 20 mm (e.g., 5 to 10 μm, 10 to 50 μm, 50 to 100 μm, 100 to 200

μm, 200 to 500 μm, 500 μm to 0.5 mm, 0.5 to 1 mm, 1 mm to 5 mm, 5 mm to 10 mm, or 10 mm to 20 mm).

In some embodiments, a layer of adhesive 86, such as a layer of resin, polymer, or epoxy adheres micro-systems 90 onto target substrate 80 and can be disposed, for example by coating or lamination. In some embodiments, a layer of adhesive 86 is disposed in a pattern. A layer of adhesive 86 can be disposed using inkjet, screening, or photolithographic techniques, for example. In some embodiments, a layer of adhesive 86 is coated, for example with a spin, spray, or slot coater, and then patterned, for example using photolithographic techniques.

Patterned electrical conductors (e.g., wires, traces, or electrodes 22 (e.g., electrical contact pads 84, micro-device electrodes 22, component electrodes 22) such as those found on printed circuit boards, flat-panel display substrates, and in thin-film circuits) can be formed on any combination of micro-systems 90 and target substrate 80, and any one can comprise substrate electrodes 85 (e.g., contact pads 84) that electrically connect to micro-systems 90. Such patterned electrical conductors and electrodes 22 can comprise, for example, metal, transparent conductive oxides, or cured conductive inks and can be constructed using photolithographic methods and materials, for example metals such as aluminum, gold, or silver deposited by evaporation and patterned using pattern-wise exposed, cured, and etched photoresists, or constructed using imprinting methods and materials or inkjet printers and materials, for example comprising cured conductive inks deposited on a surface or provided in micro-channels in or on target substrate 80 or micro-systems 90, or both.

Adhesive 86 can be a curable or cured adhesive 86. Adhesive 86 can be an uncured adhesive 86 that is subsequently cured. Uncured adhesive 86 can be an uncured adhesive 86 that is deposited on a surface of target substrate 80 as a liquid, for example by laminating, coating, or spraying adhesive 86 onto substrate surface of target substrate 80. Adhesive 86 can be a soft-cured adhesive 86, for example an adhesive 86 from which at least some, a majority, or a substantial majority of solvents or other volatile materials are evaporated or otherwise removed or driven out from uncured adhesive 86 that is still relatively malleable, compliant, or conformable compared to a hard-cured adhesive 86 and can be shaped or otherwise deformed by pressing against the soft-cured adhesive 86, for example with a component 20. An uncured or soft-cured adhesive 86 can be hard cured by, for example, by heating or exposure to electromagnetic radiation that renders adhesive 86 a cured, relatively rigid, non-compliant, non-conformable, and solid adhesive 86 with substantially reduced stickiness or adhesion compared to uncured or soft-cured adhesive 86. Thus, in some embodiments, adhesive 86 can be completely uncured, soft-cured, or hard-cured at various stages of constructing printed structures 99 of the present disclosure. A layer of soft-cured (e.g., partially cured) adhesive 86 can be patterned, for example by photolithographic processing using masks to expose the layer of uncured adhesive 86 and removing either the exposed or unexposed adhesive 86 to form a patterned layer of soft-cured adhesive 86 on target substrate 80. According to embodiments of the present disclosure, adhesive 86 can comprise an organic material, a polymer, a resin, or an epoxy. According to some embodiments, adhesive 86 is a photoresist. Adhesive 86 can be a positive photoresist, for example AZ1505 or AZ10XT from Microchemicals GmbH. Target substrate 80 can be provided in step 120 using photolithographic materials and methods known in the art.

Examples of micro-transfer printing processes suitable for disposing components 20 onto target substrates 80 are described in *Inorganic light-emitting diode displays using micro-transfer printing* (Journal of the Society for Information Display, 2017, DOI #10.1002/jsid.610, 1071-0922/17/2510-0610, pages 589-609), U.S. Pat. No. 8,722,458 entitled Optical Systems Fabricated by Printing-Based Assembly, U.S. patent application Ser. No. 15/461,703 entitled Pressure-Activated Electrical Interconnection by Micro-Transfer Printing, U.S. Pat. No. 8,889,485 entitled Methods for Surface Attachment of Flipped Active Components, U.S. patent application Ser. No. 14/822,864 entitled Chiplets with Connection Posts, U.S. patent application Ser. No. 14/743,788 entitled Micro-Assembled LED Displays and Lighting Elements, and U.S. patent application Ser. No. 15/373,865, entitled Micro-Transfer Printable LED Component, the disclosure of each of which is incorporated herein by reference in its entirety. Examples of micro-transfer printed acoustic wave filter devices are described in U.S. patent application Ser. No. 15/047,250, entitled Micro-Transfer Printed Acoustic Wave Filter Device, the disclosure of which is incorporated herein by reference in its entirety.

For a discussion of various micro-transfer printing techniques, see also U.S. Pat. Nos. 7,622,367 and 8,506,867, each of which is hereby incorporated by reference in its entirety. Micro-transfer printing using compound microassembly structures and methods can also be used in certain embodiments, for example, as described in U.S. patent application Ser. No. 14/822,868, filed Aug. 10, 2015, entitled Compound Micro-Assembly Strategies and Devices, which is hereby also incorporated by reference in its entirety. In some embodiments, any one or more of micro-systems 90 is a compound micro-assembled structure (e.g., a compound micro-assembled macro-system).

According to various embodiments, micro-system source wafer 60 can be provided with micro-systems 90, patterned sacrificial portions 64, frame tethers 66, and anchors 68 already formed, or they can be constructed as part of a method in accordance with certain embodiments. Micro-system source wafer 60 and micro-systems 90, micro-transfer printing device (e.g., a stamp 40), and target substrate 80 can be made separately and at different times or in different temporal orders or locations and provided in various process states.

Micro-systems 90, frames 10, or components 20, in certain embodiments, can be constructed using foundry fabrication processes used in the art. Layers of materials can be used, including materials such as metals, oxides, nitrides and other materials used in the integrated-circuit art. Micro-systems 90 or components 20 can have different sizes, for example, at least 100 square μm, at least 1,000 square μm, at least 10,000 square μm, at least 100,000 square μm, or at least 1 square mm. Alternatively or additionally, micro-systems 90 can be no more than 100 square μm, no more than 1,000 square μm, no more than 10,000 square μm, no more than 100,000 square μm, or no more than 1 square mm, for example. Micro-systems 90, frames 10, micro-devices 30, or components 20 can have variable aspect ratios, for example between 1:1 and 10:1 (e.g., 1:1, 2:1, 5:1, or 10:1) or can have other shapes, such as polygonal or circular shapes for example.

Various embodiments of structures and methods were described herein. Structures and methods were variously described as transferring micro-systems 90, printing micro-systems 90, or micro-transferring micro-systems 90. Micro-transfer-printing involves using a transfer device (e.g., an elastomeric stamp 40, such as a PDMS stamp 40) to transfer a micro-system 90 using controlled adhesion. For example, an exemplary transfer device can use kinetic or shear-assisted control of adhesion between a transfer device and a micro-system 90. It is contemplated that, in certain embodiments, where a method is described as including micro-transfer-printing a micro-system 90, other analogous embodiments exist using a different transfer method. As used herein, transferring a micro-system 90 (e.g., from a micro-system source wafer 60 to a target substrate 80) can be accomplished using any one or more of a variety of known techniques. For example, in certain embodiments, a pick-and-place method can be used. As another example, in certain embodiments, a flip-chip method can be used (e.g., involving an intermediate, handle or carrier substrate). In methods according to certain embodiments, a vacuum tool or other transfer device is used to transfer a micro-system 90.

As is understood by those skilled in the art, the terms "over" and "under" and "top" and "bottom" are relative terms and can be interchanged in reference to different orientations of the layers, elements, and substrates included in various embodiments of the present disclosure. Furthermore, a first layer or first element "on" a second layer or second element, respectively, is a relative orientation of the first layer or first element to the second layer or second element, respectively, that does not preclude additional layers being disposed therebetween. For example, a first layer on a second layer, in some implementations, means a first layer directly on and in contact with a second layer. In other implementations, a first layer on a second layer includes a first layer and a second layer with another layer therebetween (e.g., and in mutual contact). In some embodiments, a micro-system 90 has connection posts 24 extending therefrom and is disposed "on" a target substrate 80 with connection posts 24 disposed between target substrate 80 and micro-system 90.

Throughout the description, where apparatus and systems are described as having, including, or comprising specific elements, or where processes and methods are described as having, including, or comprising specific steps, it is contemplated that, additionally, there are apparatus and systems of the disclosed technology that consist essentially of, or consist of, the recited elements, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously.

Having described certain implementations of embodiments, it will now become apparent to one of skill in the art that other implementations incorporating the concepts of the disclosure may be used. The disclosure has been described in detail with particular reference to certain embodiments thereof, but it will be understood that variations and modifications can be effected within the spirit and scope of the following claims.

PARTS LIST

A, B, C cross section line
10 frame
12 cap
14 via
16 gap
18 cap tether
20 component
22 micro-device electrode/component electrode/electrode
22B bottom electrode
22T top electrode
24 connection post
26 component material
28 dielectric structure
30 electrically functional device/micro-device
30A electrically functional device/micro-device
30B electrically functional device/micro-device
30C electrically functional device/micro-device
32 device tether
40 stamp
42 distal end of stamp post
44 stamp opening/stamp cavity
50 cantilever support
52 cavity
60 micro-system source wafer
62 sacrificial layer
64 sacrificial portion
66 frame tether/micro-system tether
68 anchor
70 etch-stop layer
80 target substrate
84 contact pad
85 substrate electrode
86 adhesive
88 substrate circuit
90 micro-system
100 provide source wafer step
110 form micro-device step
120 optional dispose cap step
130 release structure from source wafer step
140 print structure to target substrate step
150 optional dispose cap step
160 provide target substrate step
170 form cavity step

What is claimed:

1. A micro-system, comprising:
a frame;
a component attached to and supported by the frame; and
an electrically functional micro-device disposed on or in the frame and electrically connected to the component, wherein the component is separate and spaced apart from the micro-device.

2. The micro-system of claim 1, wherein the component is exclusively supported by the frame.

3. The micro-system of claim 1, wherein the micro-device comprises one or more capacitors.

4. The micro-system of claim 3, wherein the one or more capacitors comprise no less than 20% of the frame.

5. The micro-system of claim 1, wherein the micro-device is native to the frame.

6. The micro-system of claim 1, wherein the micro-device is non-native to, and disposed on, the frame.

7. The micro-system of claim 6, wherein the micro-device is a micro-transferred micro-device printed onto the frame and comprises a broken or separated tether.

8. The micro-system of claim 1, wherein two or more of the frame, the micro-device, and the component comprise a same material.

9. The micro-system of claim 1, wherein each two or more of the frame, the micro-device, and the component comprises two or more same layers disposed in a common order.

10. The micro-system of claim 1, wherein the component is a piezoelectric micro-device or a silicon micro-device.

11. The micro-system of claim 10, wherein the component is an acoustic resonator.

12. The micro-system of claim 1, wherein the component comprises potassium sodium niobate (KNN, $KNaNbO_3$).

13. The micro-system of claim 1, wherein (i) the micro-device is operable to control or is responsive to the component, (ii) is a portion of an electrical circuit that includes both the micro-device and the component, or (iii) both (i) and (ii).

14. The micro-system of claim 1, comprising a cantilever support that physically attaches the component to the frame.

15. The micro-system of claim 14, comprising an electrode disposed on the component that extends over the cantilever support onto the frame.

16. The micro-system of claim 15, wherein the electrode is electrically connected to the micro-device.

17. The micro-system of claim 1, wherein the frame comprises at least a portion of a tether.

18. The micro-system of claim 1, comprising a cap disposed over the frame and component and adhered to the frame.

19. A micro-system wafer, comprising:
   a source wafer comprising a sacrificial layer, wherein the sacrificial layer comprises a sacrificial portion adjacent to an anchor; and
   a micro-system according to claim 1 disposed entirely over the sacrificial portion.

20. A micro-system wafer, comprising:
   a source wafer comprising an anchor; and
   a micro-system according to claim 1 suspended over a space between the micro-system and the source wafer by a tether attaching the frame to the anchor.

* * * * *